US011502402B2

(12) United States Patent
Kuo et al.

(10) Patent No.: US 11,502,402 B2
(45) Date of Patent: Nov. 15, 2022

(54) INTEGRATED PATCH ANTENNA HAVING INSULATING SUBSTRATE WITH ANTENNA CAVITY AND HIGH-K DIELECTRIC

(71) Applicant: TAIWAN SEMICONDUCTOR MANUFACTURING COMPANY LTD., Hsinchu (TW)

(72) Inventors: Feng Wei Kuo, Zhudong Township (TW); Wen-Shiang Liao, Toufen Township (TW); Ching-Hui Chen, Hisnchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 216 days.

(21) Appl. No.: 16/738,420

(22) Filed: Jan. 9, 2020

(65) Prior Publication Data
US 2020/0295453 A1 Sep. 17, 2020

Related U.S. Application Data

(60) Provisional application No. 62/819,330, filed on Mar. 15, 2019.

(51) Int. Cl.
*H01L 23/66* (2006.01)
*H01Q 1/48* (2006.01)
(Continued)

(52) U.S. Cl.
CPC .............. *H01Q 1/48* (2013.01); *H01L 21/56* (2013.01); *H01L 23/66* (2013.01); *H01Q 9/0407* (2013.01); *H01L 2223/6677* (2013.01)

(58) Field of Classification Search
CPC .. H01Q 1/2283; H01Q 1/38–48; H01L 23/66; H01L 2223/6677
See application file for complete search history.

(56) References Cited

U.S. PATENT DOCUMENTS 6,075,485 A * 6/2000 Lilly .................... H01Q 9/0407
343/895
7,405,698 B2 7/2008 de Rochemont
(Continued)

FOREIGN PATENT DOCUMENTS

JP        2018515044      6/2018
KR    20170046073      4/2017
(Continued)

OTHER PUBLICATIONS

Notice of Allowance dated Jun. 15, 2021 for corresponding case No. TW 11020563480. (pp. 1-4).
(Continued)

*Primary Examiner* — Hasan Islam
(74) *Attorney, Agent, or Firm* — Hauptman Ham, LLP

(57) ABSTRACT

A device includes a ground plane electrically connected to a proximal end of at least one conductive pillar and an antenna pad substantially parallel to the ground plane, wherein the antenna pad is separated from a distal end of the at least one conductive pillar by a dielectric pad having a first dielectric constant, wherein the ground plane, the at least one conductive pillar, and the dielectric pad surround an antenna cavity filled with a dielectric fill material having a second dielectric constant different from the first dielectric constant.

19 Claims, 14 Drawing Sheets

(51) Int. Cl.
    *H01Q 9/04*      (2006.01)
    *H01L 21/56*     (2006.01)

(56) References Cited

U.S. PATENT DOCUMENTS

| | | | |
|---|---|---|---|
| 9,300,025 | B2 | 3/2016 | Herbsommer et al. |
| 10,301,700 | B2 | 5/2019 | Liu et al. |
| 2004/0080455 | A1* | 4/2004 | Lee ............... H01Q 21/065 343/700 MS |
| 2013/0207274 | A1* | 8/2013 | Liu ................. H01L 23/66 257/774 |
| 2016/0218072 | A1 | 7/2016 | Liao et al. |
| 2017/0346185 | A1 | 11/2017 | Wang et al. |
| 2018/0145420 | A1 | 5/2018 | Kushta |
| 2018/0182525 | A1* | 6/2018 | Sprentall ............ H05K 1/0373 |
| 2019/0312347 | A1* | 10/2019 | Edwards ............ H01Q 9/0435 |

FOREIGN PATENT DOCUMENTS

| | | |
|---|---|---|
| KR | 20190009232 | 1/2019 |
| KR | 20190013383 | 2/2019 |
| TW | 201043107 | 12/2010 |
| TW | 201608758 | 3/2016 |
| TW | 201715661 | 5/2017 |
| TW | I595761 | 8/2017 |

OTHER PUBLICATIONS

Office Action dated Aug. 27, 2021 for corresponding case No. CN 202010156199.2 (pp. 1-11).

Notice of Allowance dated Dec. 8, 2020 for corresponding application No. KR 10-2020-0012906. (pp. 1-7).

* cited by examiner

US 11,502,402 B2

INTEGRATED PATCH ANTENNA HAVING INSULATING SUBSTRATE WITH ANTENNA CAVITY AND HIGH-K DIELECTRIC

PRIORITY CLAIM

This application claim the priority of U.S. Provisional Application No. 62/819,330, filed Mar. 15, 2019, which is incorporated herein by reference in its entirety.

BACKGROUND

Antennas are used in radio frequency (RF) systems to receive and transmit data, including data for mobile devices such as cellular telephones. Antennas are frequently designed separately from radio frequency integrated circuit (RFIC) dies for frequencies up to 60 gigahertz (GHz), and combined into a single device in a packaging operation. Separate manufacturing followed by packaging allows for improved antenna performance for many RF systems. Antennas are integrated using an RFIC die using a redistribution structure (RDS) in an integrated-fan out (InFO) package. InFO packages are developed to meet higher-frequency RF transceiver design specifications.

DETAILED DESCRIPTION

Figure 1:
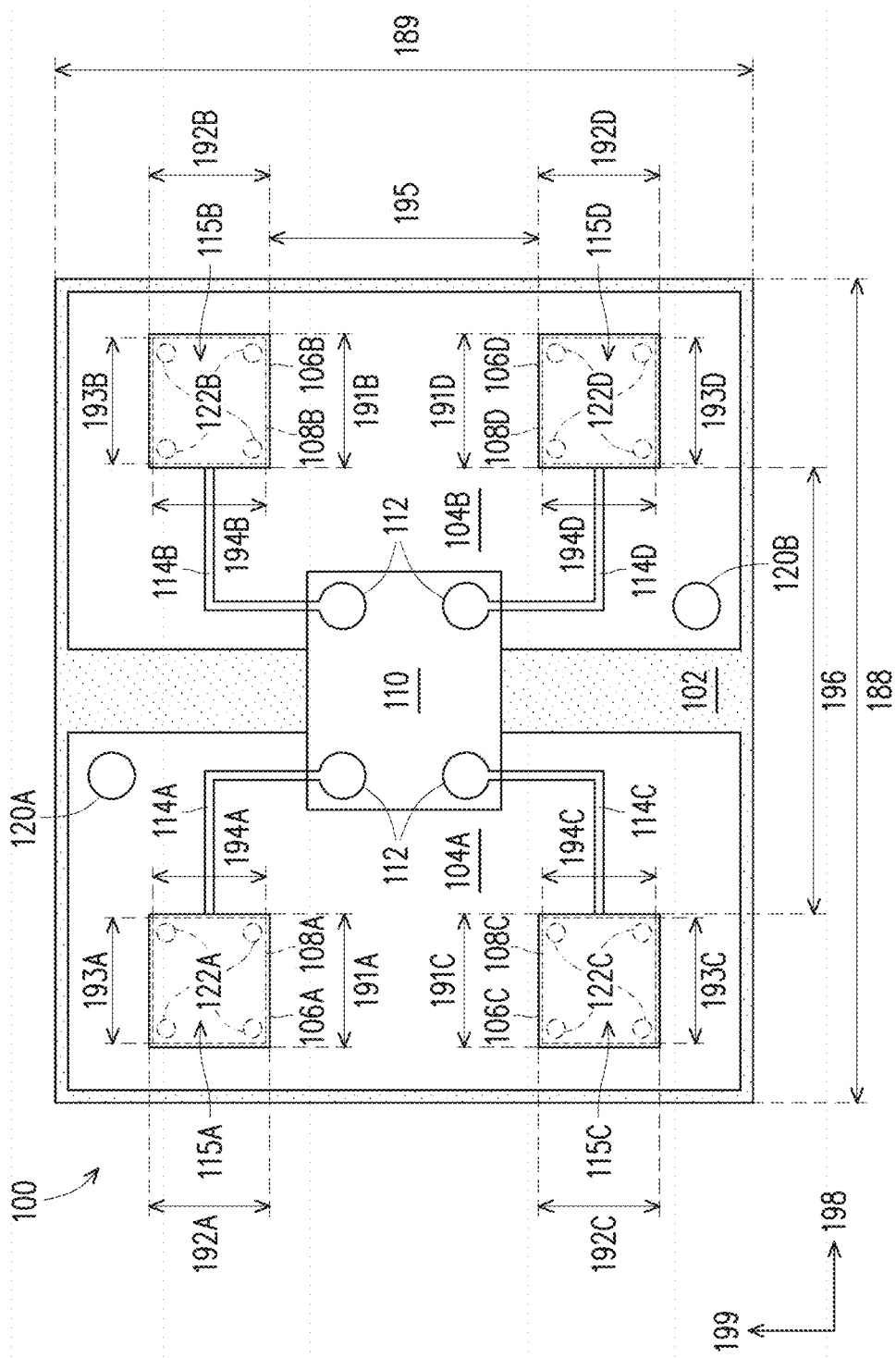
FIG. 1 is a top view of a patch antenna in a semiconductor device, in accordance with some embodiments.

The following disclosure provides many different embodiments, or examples, for implementing different features of the provided subject matter. Specific examples of components, values, operations, materials, arrangements, etc., are described below to simplify the present disclosure. These are, of course, merely examples and are not intended to be limiting. Other components, values, operations, materials, arrangements, etc., are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Patch antennas are of interest for antenna/radio frequency integrated circuit (RFIC) die integration using an integrated fan out (InFO) package structure because patch antennas are easy to fabricate using lithographic patterning techniques such as printed circuit board etching and semiconductor processing steps. A patch antenna includes a ground plane and an antenna pad (an antenna patch) spatially separated from a ground plane by a dielectric substrate. An antenna cavity is a region between the antenna pad and the ground plane. An antenna cavity is a resonant cavity that allows for electromagnetic waves to radiate to or from the antenna pad.

Patch antennas for antenna or RFIC die InFO package structure are able to be manufactured using lithographic and integrated circuit manufacturing processes. Patterning techniques include deposition of patterning materials (e.g., photoresist, and so forth), transferring a pattern to the patterning materials (e.g., photolithography, electron beam lithography, or other pattern transfer techniques used in IC manufacturing), and etching of exposed materials uncovered within openings in patterning material after pattern transfer. Etching of the exposed materials includes plasma etching and immersive etching (dip tank or spray-on etchant techniques, for example).

A patch antenna includes a ground plane of conductive material and an antenna pad for an antenna spatially separated from the ground plane by at least one dielectric material. The ground plane and patch for an antenna region comprise substantially parallel plates of conductive material. The lateral dimensions of the ground plane and patch for an antenna region are adjusted in order to tune the radiofrequency (RF) characteristics of the antenna. Adjusting the lateral dimensions of the antenna also adjusts the impedance of the antenna and the operating frequency.

An InFO package, or an InFO device, has one or more antenna pads electrically connected to an RF controller die (a die) to send, receive, and interpret RF signals from other devices. Each patch antenna includes a ground plane electrically connected to at least one conductive pillar, an antenna pad, and has an antenna cavity located between the ground plane, and the antenna pad. In some embodiments, conductive pillars electrically connected to the ground plane are within a projection of the perimeter of the antenna pad onto the ground plane. The antenna cavity is filled with a low-κ dielectric material (e.g, κ> about 1 F/m to κ< about 6 F/m). Low-κ dielectric materials with a dielectric constant less than about 1 F/m are fragile to work with and tend to fracture during die cutting or device separation after a manufacturing process. Low-κ dielectric materials with a dielectric constant above 6 F/m do not provide sufficient decoupling of the antenna pads and ground plane, or antenna pads and the die of the InFO package. A high-κ dielectric material (e.g., κ> about 7 F/m) is located between the antenna cavity and the patch region of the patch antenna. The Antenna cavity improves the reflection coefficient, the $S_{11}$ parameter, of the antenna pad/patch antenna in the InFO package. The low-κ dielectric material is in and around the RF die within the device. The high-κ dielectric material (high-κ dielectric pad, or dielectric pad) is between the antenna cavity and the antenna pad, and increases RF and radiation efficiency. Inclusion of high-κ dielectric material between an antenna pad and the antenna cavity helps to facilitate reduction in the lateral dimensions of the antenna pad and/or ground plane. The low-κ dielectric material is an insulator between conductive pillars, the ground plane, and the RF die. In some embodiments, a different low-κ dielectric materials are used in different layers of the InFO package. Some layers of an InFO package includes insulators such as polyimide, PBO, MC, silicon dioxide, spin on glass (SOG), ceramics, aluminum oxide ($Al_2O_3$), and so forth.

FIG. 1 is a top view of a patch antenna in a semiconductor device 100, in accordance with some embodiments. An insulating material 102 (a first insulating material) is situated on a substrate (not shown). In some embodiments, the insulating material is a polyimide layer for encapsulating conductive materials and providing protection from moisture or electrical voltage sources. Ground planes 104A and 104B are located above the insulating material 102. Ground planes 104A and 104B are layers of conductive material (e.g., copper, titanium, aluminum, or alloys thereof) which have been deposited over the insulating material. Ground planes 104A and 104B are electrically connected to a semiconductor device or printed circuit board ground connection by grounding connections 120A and 120B. In some embodiments, grounding connections 120A and 120B include vias or conductive lines which extend upward from the grounding plane of a semiconductor device to the ground connection of the semiconductor device or printed circuit board.

Sets of conductive pillars 122A-122D are electrically connected to a ground plane of the semiconductor device. Conductive pillars are formed by, e.g., depositing a seed layer and electroplating a conductive material into openings in a sacrificial patterning material deposited over a ground plane during a manufacturing process. In some embodiments, an insulating layer is deposited over the ground plane prior to the conductive pillar manufacturing operations, and the insulating material is partially removed through openings in the sacrificial patterning material prior to manufacturing the conductive pillars. Each of sets of conductive pillars 122A, 122B, 122C, and 122D contains four pillars. In some embodiments, the number of conductive pillars in a set of conductive pillars ranges from 1 pillar to 10 pillars, although other numbers of conductive pillar are also within the scope of the present disclosure. A set of conductive pillars is associated with each antenna pad and/or dielectric pad of the semiconductor device. A number of conductive pillars for each antenna pad is determined based on the area of the conductive pad and/or dielectric pad, the frequency of the antenna, and the thickness of the molding compound (dielectric filler material) between the ground plane and the antenna pad and/or dielectric pad of the semiconductor device.

Antenna pads 106A and 106C are positioned over ground plane 104A. Antenna pads 106B and 106D are positioned over ground plane 104B. In some embodiments, each ground plane is associated with a single antenna pad. In some embodiments, a ground plane is associated with at least three antenna pads in the semiconductor device. In some embodiments, a ground plane has one lateral dimension equal to a lateral dimension of the antenna pad and/or dielectric pad of a semiconductor device.

In semiconductor device 100, each antenna pad (e.g., antenna pads 106A-106D) has an associated intervening dielectric pad between the antenna pad and the closest ground plane, and has an associated set of conductive pillars selected from sets of conductive pillars 122A-122D. Thus, dielectric pad 108A is positioned between antenna pad 106A and ground plane 104A, and set of conductive pillars 122A is positioned below dielectric pad 108A and electrically connected to ground plane 104A. Dielectric pad 108B is positioned between antenna pad 106B and ground plane 104B, and set of conductive pillars 122B is positioned below dielectric pad 108B and electrically connected to ground plane 104B. Dielectric pad 108C is positioned between antenna pad 106C and ground plane 104A, and set of conductive pillars 122C is positioned below dielectric pad 108C and electrically connected to ground plane 104A. Dielectric pad 108D is positioned between antenna pad 106D and ground plane 104B, and set of conductive pillars 122D is positioned below dielectric pad 108D and electrically connected to ground plane 104B. Beneath each antenna pad, and each dielectric pad, four conductive pads are positioned on the ground plane within both of a perimeter (looking downward) of the dielectric pad and a perimeter of the associated antenna pad of the semiconductor device as projected onto the ground plane below the antenna pad and dielectric pad. In some embodiments, wherein the perimeter of the dielectric pad and the perimeter of the antenna pad are different perimeters having different dimensions, the conductive pillars are within a projected perimeter of only one of the dielectric pad and the antenna pad. In some embodiments, the number of conductive pillars ranges from 1 to up to 10, although other numbers of conductive pillars are also within the scope of the present disclosure. In semiconductor device 100, the top surface (not shown) (e.g., the distal end of the conductive pillars 122A-122D) are in direct contact with the bottom surface (not shown) of the dielectric pad associated with an antenna pad. In some embodiments, an insulating layer separates the top surface of the conductive pillars from the bottom surface of the dielectric pad.

An antenna cavity is a volume between, at one side, the dielectric pad and the antenna pad, and at another side, the ground plane. In some embodiments, the conductive pillars are positioned toward edges or corners of the projected perimeter of the dielectric pad and/or the edges or corners of the projected perimeter of the antenna pad, and the antenna cavity is further between the conductive pillars. In some embodiments, one or more conductive pillars are located toward the center of the volume between: the dielectric pad and the antenna pad, and the ground plane, and the antenna cavity surrounds the conductive pillars. Thus, in semiconductor device 100, antenna cavity 115A is located between dielectric pad 108A and ground plane 104A, and roughly between conductive pillars 122A. Dielectric pad 108A is between antenna cavity 115A and antenna pad 106A. Antenna cavity 115B is located between dielectric pad 108B and ground plane 104B, and roughly between conductive pillars 122B. Dielectric pad 108B is between antenna cavity 115B and antenna pad 106B. Antenna cavity 115C is located between dielectric pad 108C and ground plane 104A, and roughly between conductive pillars 122C. Dielectric pad 108C is between antenna cavity 115C and antenna pad 106C. Antenna cavity 115D is located between dielectric pad 108D and ground plane 104B, and roughly between conductive pillars 122D. Dielectric pad 108D is between antenna cavity 115D and antenna pad 106D.

The dielectric pads have a first dimension (e.g., a dielectric pad length) in a first direction 198, and a second dimension (e.g., a dielectric pad width) in a second direction 199. Antenna pad 106A has an antenna pad length 191A in the first direction 198 and an antenna pad width 192A in the second direction 199. Antenna pad 106B has an antenna pad length 191B in the first direction 198 and an antenna pad width 192B in the second direction 199. Antenna pad 106C has an antenna pad length 191C in the first direction 198 and an antenna pad width 192C in the second direction 199. Antenna pad 106D has an antenna pad length 191D in the first direction 198 and an antenna pad width 192D in the second direction 199. Dielectric pad 108A has a dielectric pad length 193A in the first direction 198 and a dielectric pad width 194A in the second direction 199. Dielectric pad 108B has a dielectric pad length 193B in the first direction 198 and a dielectric pad width 194B in the second direction 199. Dielectric pad 108C has a dielectric pad length 193C in the first direction 198 and a dielectric pad width 194C in the second direction 199. Dielectric pad 108D has a dielectric pad length 193D in the first direction 198 and a dielectric pad width 194D in the second direction 199. According to some embodiments, the dielectric pad length is the same as the antenna pad length. According to some embodiments, the dielectric pad length is greater than the antenna pad length. According to some embodiments, the dielectric pad length is smaller than the antenna pad length. According to some embodiments, the dielectric pad width is the same as the antenna pad width. According to some embodiments, the dielectric pad width is greater than the antenna pad width. According to some embodiments, the dielectric pad width is smaller than the antenna pad width. The dimensions of the antenna pad, and the dielectric pad, are selected prior to a manufacturing process, in order to set the impedance of the semiconductor device/antenna and the frequency of the semiconductor device/antenna.

In semiconductor device 100, a first antenna pad spacing 195 separates antenna pad 106B and antenna pad 106D, and a second antenna pad spacing 196 separates antenna pad 106C and antenna pad 106D. In some embodiments, the first antenna pad spacing and the second antenna pad spacing are the same distance. In some embodiments, one or both of the first antenna pad spacing and the second antenna pad spacing is the distance equal to one half wavelength of the RF wavelength the antenna is designed to receive. In some embodiments, the first antenna pad spacing and the second antenna pad spacing are different distances.

According to some embodiments, the semiconductor device (e.g., a patch antenna array, or interposer) has a total length 188 in the first direction 198 of about 5 millimeters (mm), and a total width 189 in the second direction 199 of about 5 millimeters. In some embodiments, the total length and/or the total width of the semiconductor device (patch antenna array, or interposer) ranges from about 2 mm to about 10 mm, according to the dielectric constant of the high-κ dielectric pad (see below) deposited between the antenna pad and the antenna cavity, and the wavelength or impedance of the antenna pad/patch antenna. In some embodiments, the dimensions of the antenna pads (antenna pad length, and/or antenna pad width) ranges from 0.4 mm to about 4.5 mm. Dimensions of antenna pads smaller than about 0.4 mm are associated with antennas that produce frequencies higher than 150 GHz, which have limited transmission distance based on the power available to an integrated antenna device as disclosed herein. Dimensions of antenna pads greater than about 4.5 mm take up considerable space on a circuit board, impacting device layout and making placement of other chips and routing more difficult.

Antenna pads are electrically connected to a controller die 110 by conductive lines (e.g., redistribution lines). Thus, antenna pad 106A is electrically connected to controller die 110 by conductive line 114A, antenna pad 106B is electrically connected to controller die 110 by conductive line 114B, antenna pad 106C is electrically connected to controller die 110 by conductive line 114C, and antenna pad 106D is electrically connected to controller die 110 by conductive line 114D. Contacts 112 on a top surface of controller die 110 electrically connect to conductive lines 114A-114D in order to complete the circuit between the antenna pads 106A-106D and the controller die 110. In some embodiments, conductive lines are in a same layer of the semiconductor device as the antenna pads and are manufactured in a same manufacturing operation as the antenna pads. In some embodiments, conductive liens are in a different layer of the semiconductor device from the antenna pads and are manufactured in a different manufacturing operation as the antenna pads.

Figure 2:
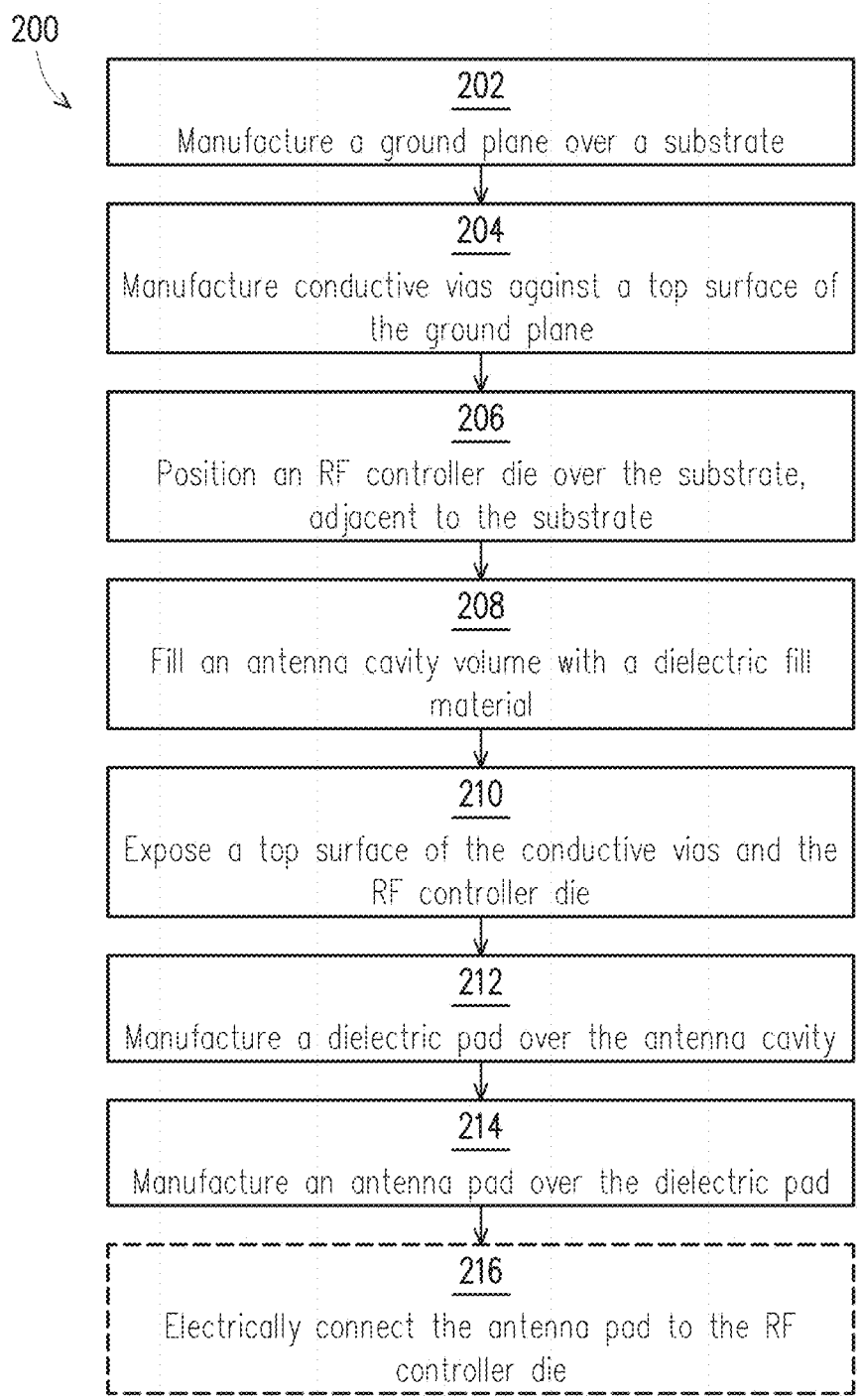
FIG. 2 is a flow diagram of a method of making a patch antenna in a semiconductor device, in accordance with some embodiments.

FIG. 2 is a flow diagram of a method 200 of making a patch antenna in a semiconductor device, in accordance with some embodiments. Method 200 includes an operation 202 wherein a ground plane is manufactured over a substrate. Operation 202 includes steps associated with building a printed circuit board or encapsulated semiconductor device for packaging or combination with other circuit boards or encapsulated semiconductor devices. Thus, in one step of operation 202, a release layer is applied to a rigid substrate prior to making the semiconductor device. A release layer includes films or materials such as a light transfer heat conversion (LTHC) layer which is applied as a liquid by, e.g., spin coating, and cured to dryness. A release layer is a layer of material which holds materials deposited on top of the release layer in a rigid manner during a manufacturing process, and which is separable from the substrate on which the release layer has been deposited without causing damage to the materials deposited over the release layer. In one non-limiting embodiment, a LTHC layer is deposited onto an optically transparent (e.g., glass or quartz) substrate during a manufacturing process. The LTHC layer, after curing, is adhesive and holds materials deposited during the manufacturing process. The LTHC layer is released from the optically transparent substrate by exposing the LTHC layer to light having a wavelength that causes the THC to soften or break down before separating from the optically transparent substrate.

In some embodiments, an insulating layer is deposited over the release layer. An insulating layer provides protection from physical, chemical, or electrical exposure after a semiconductor device is manufactured and separated from the rigid substrate. A non-limiting example of an insulating layer is polyimide material used for packaging and passivating top surfaces of integrated circuits after a manufacturing process. In some embodiments, the polyimide material is applied by spin-coating. The thickness of a polyimide insulating layer is determined by the rotational velocity of the rigid substrate during spin-coating, and by the type of polyimide material applied to the rigid substrate.

Some embodiments of operation 202 include steps associated with deposition of a seed layer for copper electroplating as part of manufacturing a ground plane. In some embodiments, seed layer deposition is performed using atomic layer deposition (ALD), plasma enhance ALD (PE-ALD), chemical vapor deposition (CVD), plasma enhanced CVD (PECVD), low-pressure CVD (LPCVD), sputtering, or other deposition techniques to deposit seed layer material over the rigid substrate. In some embodiments, the rigid substrate is a circular disk configured to fit into manufacturing equipment for integrated circuit manufacturing and to undergo processing steps similar to integrated circuit manufacturing steps. Thus, a rigid substrate is, in some embodiments, a circular glass or quartz disk configure to fit into an integrated circuit manufacturing tool such as a plasma enhanced CVD deposition tool to receive a seed layer over the release layer on the substrate. A seed layer comprises, in some embodiments, copper, titanium, aluminum, or alloys thereof, deposited over the insulating layer. In some embodiments, the seed layer has a thickness ranging from about 1 micrometer (micron, or μm) to about 5 micrometers. Seed layers thinner than about 1 micron tend to have thin or spotty coverage of a surface, leading to uneven coverage of the ground plane material after electroplating. Seed layers having a thickness between about 1 micrometer and about 5 micrometers are effective at producing electroplated films with good coverage. Seed layers thicker than about 5 microns tend to waste time during the seed layer deposition process which could be better used in electroplating. The seed layer deposition rate is low enough, as compared to the rate at which ground plane material is deposited by electroplating that thick seed layers waste time in the manufacturing process.

Operation 202 includes steps associated with depositing ground plane material over the insulating layer. In some embodiments of operation 202, depositing ground plane material includes electroplating the ground plane material onto the seed layer. In some embodiments, the ground plane material is copper. For example, copper electroplating is able to produce films of copper on seed layers at a wide range of thicknesses according to the duration of the electroplating process. In some embodiments, electroplating copper onto a seed layer produces a copper layer having a thickness ranging from 5 micrometers to 10 micrometers. In some embodiments, the ground plane material is a layer of copper having a thickness of about 7 micrometers. Ground plane material having a thickness of about 7 micrometers is consistent with a wide range of circuit board manufacturing equipment without special modification of the equipment or processes to manufacture patch antennas.

In operation 202, subsequent to depositing the ground plane material over the insulating layer, the ground plane material is formed into patterned ground planes. In some embodiments, a layer of patterning material (e.g., photoresist) is deposited onto the ground plane material and a pattern is transferred to the layer of patterning material. In transferring the pattern to the layer of patterning material, portions of the patterning material are removed above portions of the ground plane material to be removed from the insulating layer, and portions of the ground plane material are obscured by the remaining portions of the patterning material. In some embodiments, the patterning material is patterned by photolithography, electron beam lithography, or some other patterning technique compatible with the patterning material applied over the ground plane material.

Operation 202 also includes steps associated with etching the ground plane material exposed by removing portions of the patterning material. In some embodiments, the ground plane material is copper or a copper alloy. In some embodiments, copper and/or copper alloys are etched from over the insulating layer with a solution of acetic acid and hydrogen peroxide. In some embodiments, copper and/or copper alloys are etched from over the insulating layer with a mixture of an ionic oxidizing agent, a pH adjuster, and a complexing agent. Oxidizing agents include strong acids such as nitric acid, sulphuric acid, and/or phosphoric acid. pH adjusters include buffering compounds to hold the pH of a solution within a range effective at dissolving ground plane material. A complexing agent includes molecules such as EDTA (ethylenediaminetetraacetic acid), which prevent atoms dissolved from the ground plane material from re-depositing on the exposed surfaces, and/or promote further dissolving of the ground plane material because the concentration of free ions/atoms of ground plane material remains low (as compared to the concentration of complexed ions/atoms of ground plane material.

Method 200 includes an operation 204, wherein conductive vias are manufactured against the top surface of the ground plane. According to some embodiments, patterned ground plane material (e.g., ground planes is) are covered with a second insulating material prevent corrosion and to protect the ground planes from electrical and/or physical damage. In some embodiments, the second insulating material is a resin or organic material. In some embodiments, the second insulating material is a polyimide material similar to insulating material 102 (first insulating material) deposited over the rigid substrate.

Operation 204 includes step wherein a second patterning material is deposited over the second insulating layer. In some embodiments, the second patterning material is a layer of photoresist. In operation 204, second patterning material receives a pattern through, e.g., photolithography or electron-beam lithography, although other methods of pattern transfer are also envisioned within the scope of the present disclosure. The pattern transferred to the second patterning material corresponds to positions of openings through the second patterning material at locations for conductive pillars electrical connected to the ground planes. In operation 204, after transfer of a pattern to the second patterning material, and etch process is performed in order to remove exposed portions of the insulating layer at the bottom of openings through the second patterning material to expose regions of patterned ground plane material.

Upon exposing portions of the patterned ground plane material, operation 204 includes depth associated with depositing seed material and electroplating conductive pillar material similar to the seed material deposition and ground plane electroplating steps recited above. During deposition of seed layer material, a seed layer comprising copper, titanium, aluminum, alloys thereof, and/or other conductive materials supplied against exposed portions of the ground planes, sidewalls of openings through the second patterning material, and on a top surface of the second patterning material during electroplating of conductive pillar material, the pillar material (e.g., copper), is deposited onto the seed layer. According to some embodiments, the seed layer deposited into openings through the second pattern material has a thickness ranging from about 1 μm to about 5 μm. When a seed layer has a thickness less than about 1 μm, coverage of the seed layer over the base onto which the seed layer is being deposited tends to be incomplete, leading to poor coverage of the electroplated material. When a seed layer has greater thickness than about 5 μm, the time spent depositing the seed layer does not provide additional benefit in terms of coverage of electroplating. According to some embodiments, the diameter of openings through the second patterning material range from 50 μm to 500 μm. The height of a conductive pillar corresponds to the thickness of the second patterning material through which an opening has been formed. According to some embodiments, the height of pillar ranges from 150 μm to about 700 μm. In some embodiments, the diameter of openings in second patterning material is about 120 μm. In some embodiments, the depth of the opening through the second patterning material, or the height of the conductive pillar deposited within the opening to the second patterning material, is about 250 μm. Conductive pillars having widths of about 120 μm and heights of about 250 μm are able to be manufactured by printed circuit board manufacturing processes without special modification of the equipment or processes to manufacture patch antennas.

In operation 204, subsequent to electroplating of the conductive pillar material over the seed layer, a chemical mechanical polishing step, or planarization step, is performed in order to expose the patterning material below the seed layer. In an additional step in operation 204, the second patterning material is removed to expose sidewalls of the conductive pillars formed against the top surface of the ground planes and extending through the second insulating material.

Method 200 includes an operation 206, wherein a die (an RF controller die, or control die) is positioned over the substrate. In some embodiments, the die is attached to the antenna assembly at the second insulating layer (e.g., the polyamide layer). According to some embodiments, the polyamide layer has a thickness ranging from five to 15 μm. The die is attached by a die attach film (DAF) having a thickness ranging from five μm to 12 μm. In some embodiments, the DAF thickness is about 10 μm. Die attach film thicknesses less than 5 μm, the die tends not to be sufficiently attached and is prone to being dislodged during handling. Die attach film thicknesses greater than about 12 μm do not confer additional benefit during a manufacturing process and are sometimes associated with overflow of die attach film material around the base of the die, leading to voids inside the semiconductor device.

Method 200 includes an operation 208, wherein a dielectric film material is deposited to an antenna cavity (antenna cavity volume). Dielectric fill material is a low-κ dielectric material which fills space between the conductive pillars and the attached die. According to some embodiments, the low-κ dielectric materials used in the semiconductor device, including both the dielectric fill material to surround the conductive pillars and to be deposited at higher layers in the device, have a dielectric constant of less than 6 Farads/meter (F/m). High-κ dielectric materials used for the dielectric pad (see below) have a dielectric constant greater than 7 Farads/meter. In some embodiments, the high-κ dielectric materials used for the dielectric pad have a dielectric constant of greater than 50 Farads/meter (see operation 212, below).

In some embodiments, the dielectric fill material includes polymeric materials deposited over the rigid substrate using, e.g., spin coating to provide uniform thickness and eliminate voids within the dielectric fill material. In some instances, the dielectric fill material is a molding compound to provide support or rigidity around the conductive pillars and for the die. In some embodiments, the dielectric fill material is a spin-on glass (SOG), CVD-$SiO_2$, and CVD-deposited silicon nitride ($SiN_x$) or silicon oxy-nitride ($SiO_xN_y$). Low-κ dielectric materials used to fill the antenna cavity, and in subsequent (e.g., higher) layers of the semiconductor device have curing temperatures at or below about 200 degrees Celsius (° C.).

As described further below, high-κ dielectric materials used to form the dielectric pads have curing temperatures, (where appropriate) of at least 210° C., such as liquid-phase (or, spin-on) silicon nitride (κ of about 6.9 F/m) or a laminated set of films including a first layer of $ZrO_2$, an intermediate film of $Al_2O_3$, and a second layer of $ZrO_2$ (ZAZ, κ of about 13.6 F/m), or other high-κ dielectric materials such as $ZrO_2$ (κ of about 25 F/m), $Al_2O_3$ (κ of about 9 F/m) $HfO_x$, $HfSiO_x$, $ZrTiO_x$, $TaO_x$, $TiO_2$, and $Y_2O_3$ (κ of about 15 F/m). Liquid high-κ polymers include polyimide polymers, which cure at temperatures around or below 100° C., and produce a reduced amount of strain or stress on the die or the conductive pillars during the curing process.

In some embodiments, the dielectric fill material is deposited at a thickness such that a distal end of the conductive pillars is not covered by the dielectric fill material. A distal end of the conductive pillars is the end of the conductive pillars not attached to the ground plane. A proximal end of the conductive pillars is the end of conductive pillars attached to the ground plane. In some embodiments, the dielectric fill material completely covers the conductive pillars and the die. In some instances, a second dielectric material is deposited over the dielectric fill material. In some instances, the second dielectric material has a different dielectric constant than the dielectric constant of the dielectric fill material. In some embodiments, the second dielectric material comprises suspension of silicon dioxide particles within an organic resin. In some embodiments, silicon dioxide particles are included in a second dielectric material to promote uniform removal of the second dielectric material during a planarization step. The deposited dielectric fill material, and any second dielectric material deposited over the dielectric fill material, is cured at a low temperature in order to harden the materials without causing thermal damage to the insulating layer below the ground plane, or to the components of the RF controller/die deposited over the insulating layer by, e.g., the die attach film. Low temperature curing increases the overall yield of the semiconductor device by reducing the amount of ion diffusion in transistors of the RF controller/die. In some embodiments, low temperature curing occurs at curing temperatures not greater than 200° C. In some embodiments, the thermal budget (e.g., the temperature window for low-damage or damage-free thermal processing of the semiconductor device includes is the same for the curing of the dielectric fil material and the formation of the dielectric material in the high-κ dielectric pads.

Method 200 includes an operation 210 in which a top surface of the conductive vias and the RF controller die are exposed. In some embodiments, a planarization step is used to expose the top surface of the conductive vias and the RF controller die. In some embodiments, planarization of the dielectric material and/or conductive pillar material is accomplished by chemical mechanical polishing (CMP), wherein a pad is applied to the top surface of the semiconductor device during the manufacturing process. During chemical mechanical polishing, the pad is rubbed against the semiconductor device, and slurry, a mixture of small-diameter particles and a friction-reducing fluid, abrades the top surface of the semiconductor device. In some embodiments, chemical mechanical polishing is performed for a predetermined time based on a thickness or amount of dielectric material deposited on the semiconductor device. In some embodiments, chemical mechanical polishing is performed using an endpoint technique to determine that sufficient dielectric material has been removed from the semiconductor device.

An antenna cavity formed above the ground plane and within a volume surrounded by the at least one conductive pillar to the ground plane. The antenna cavity is filled with dielectric fill material and/or a second dielectric material to a top surface of the semiconductor device after dielectric fill material is applied to fill spaces between conductive pillars and the die. According to some embodiments, the dielectric constant of the dielectric fill material and/or second dielectric material are approximately the same in order to reduce capacitive effects on the performance of the antenna.

Method 200 includes an operation 212, wherein a dielectric pad is manufactured over the antenna cavity. According to some embodiments, the dielectric pad is a single layer of high-k (e.g., high dielectric constant κ) dielectric material. According to some embodiments, the dielectric pad includes multiple layers of high-κ dielectric materials. In some embodiments, layers of high-κ dielectric materials alternate with layers of silicon dioxide ($SiO_2$). For purposes of the present disclosure, a high-κ dielectric material is a dielectric material having a dielectric constant greater than about 50 Farads per meter (F/m). According to some embodiments, high-κ dielectric materials include materials such as titanium dioxide ($TiO_2$, κ of about 83 to 100 Farads per meter (F/m)), strontium titanium trioxide ($SrTiO_3$, κ of about 200 Farads per meter (F/m)), barium strontium titanium trioxide ($BaSrTiO_3$, κ of about 250-300 Farads per meter (F/m)), barium titanium trioxide ($BaTiO_3$, κ of about 500 Farads per meter (F/m)), lead zirconium titanium trioxide ($PbZrTiO_3$, κ of about 1000-1500 Farads per meter (F/m)), and so forth. Silicon dioxide (SiO 2) has a dielectric constant of about 3.7-3.9 Farads per meter (F/m). High-κ dielectric materials for the dielectric pad include liquid (spin on) silicon nitride (κ of about 6.9 F/m), a laminated set of films including a first layer of $ZrO_2$, an intermediate film of $Al_2O_3$, and a second layer of $ZrO_2$ (ZAZ, κ of about 13.6 F/m), or other high-κ dielectric materials such as $ZrO_2$ (κ of about 25 F/m), $Al_2O_3$ (κ of about 9 F/m) $HfO_x$, $HfSiO_x$, $ZrTiO_x$, $TaO_x$, $TiO_2$, and $Y_2O_3$ (κ of about 15 F/m).

According to some embodiments, the layer(s) of material for the dielectric pad are deposited to a total thickness of between about 1 micrometer to about 4 micrometers, although other thicknesses are considered to be within the scope of the present disclosure. High-κ dielectric films generally have non-uniform thickness and uneven coverage over the substrate where the film is being deposited or grown for thicknesses below 1 micrometer (μm). Films with thicknesses greater than about 4 micrometers have approximately the same effect, in terms of frequency shifting of the InFO semiconductor device, as compared to an InFO device with no high-κ dielectric pad, and device shrink, while taking additional time to manufacture. Film uniformity across a semiconductor device is not improved significantly when total dielectric thickness is greater than about 4 micrometers.

Films for the high-κ dielectric pad are deposited using techniques such as atomic layer deposition (ALD), chemical vapor deposition (CVD), plasma enhanced CVD (PECVD), low pressure CVD (LPCVD), laser enhanced CVD (LECVD), electron gun (E-gun), and so forth, using equipment and processes known to those skilled in the art. In some embodiments, multiple films are deposited in a single manufacturing step wherein the deposition chemistry is modified without removing the substrate from a film deposition chamber. In some embodiments, a single film is deposited in a single chamber, and a second film of the high-κ dielectric pad is deposited in a second chamber in order to achieve particular dielectric characteristics of the high-κ dielectric material.

Operation 212 includes steps associated with isolating portions of the blanket dielectric layer(s) deposited over the dielectric fill material and the conductive pillars. In some embodiments of operation 212, a layer of patterning material is deposited over the high-κ dielectric layers and a pattern corresponding to the pattern of the high-κ dielectric pads is transferred to the layer of patterning material. In some embodiments, the patterning material is a layer of photoresist or other patterning material. In some embodiments, the pattern is transferred to the patterning material via photolithography, electron-beam lithography, or some other pattern transfer technique. In some embodiments, the pattern includes a single high-κ dielectric pad per antenna cavity. In some embodiments, the pattern includes a single high-κ dielectric pad over multiple antenna cavities. In some embodiments, the semiconductor device has some antenna cavities without high-κ dielectric pads over the ground plane.

In operation 212, exposed portions of the high-κ dielectric layer(s) are etched away using, e.g., an immersion etch containing strong acids, or a plasma etch configured to break down and remove high-κ dielectric materials, while keeping the device temperature relatively cool (e.g., below about 200° Celsius). The top surface, including conductive pads or contact pads thereon, of the die is also exposed by the etch process in order to enable subsequent electrical connections to the die for the InFO structure of the semiconductor device.

The high-κ dielectric pad above one or more antenna cavities has a thickness ranging from about 1 micrometer to about 4 micrometer, although other thicknesses are also within the scope of the present disclosure. By placing a high-κ dielectric pad over the top of an antenna cavity, the upper frequency range of the InFO antenna/patch antenna is increased to frequencies ranging from about 30 GigaHertz (GHz) to about 120 GHz, suitable for cellular telephone antenna transmissions and/or e.g. automotive control system radars. The presence of a high-κ dielectric pad over an antenna cavity (and between the antenna cavity and the antenna pad of the InFO device/semiconductor device) also increases the radiation efficiency of the InFO device, reducing the power requirement for operating the device. The presence of a high-κ dielectric pad over an antenna cavity allows circuit designers to shrink the footprint of an InFO device/semiconductor device while still preserving current technology performance, and with some or all of the above-mentioned frequency range and power efficiency features.

The presence of a low-κ dielectric material in the antenna cavity isolates conductive pillars from each other, and the ground plane from the antenna pad, reducing the capacitance between the conductive pillars and the ground plane for each portion of the semiconductor device. The low-κ dielectric material in the antenna cavity also reduces induction between components in the InFO device, and increases the structural stability of the device (as compared to InFO devices having, e.g., air gaps around antenna pads).

In some embodiments, a layer of low-κ dielectric material is deposited over the high-κ dielectric pad material. The low-κ dielectric material is planarized in order to expose the high-κ dielectric material, while the low-κ dielectric material covers the electrical connections (pads, and so forth) of the die to isolate the top surface of the die. Thus, in some embodiments, the bottom surface of a high-κ dielectric pad is in direct contact with the low-κ dielectric material of the antenna cavity (and, optionally, is also in contact with the top sides of the conductive pillars), the sides of the high-κ dielectric pad are in direct contact with the low-κ dielectric material deposited over the high-κ dielectric pad, and some (or all) of the top surface of the high-κ dielectric pad is in direct contact with the antenna pad (see below).

In some embodiments, after planarization of the low-κ dielectric material is complete, conductive vias extending through at least the low-κ dielectric material are manufactured to make electrical connections to the die.

Method 200 includes an operation 214, wherein an antenna pad is manufactured over the antenna cavity.

In some embodiments, operation 214 includes steps which simultaneously manufacture electrical connection to conductive vias extending through the low-κ dielectric material over the die, and at the same layer as the high-κ dielectric pads, and optional operation 216 is omitted from the method. In some embodiments, the antenna pads are manufactured, and electrical connection of the antenna pads is formed separately from the manufacture of the antenna pad. Thus, optional operation 216 is performed when, e.g., the antenna pad and the RF controller die are connected at a different layer in the device than the layer having the antenna pad.

Manufacturing of an antenna pad in operation 214 is according to steps similar to those recited hereinabove with respect to forming the conductive pillars over the ground plane, in operation 204. In some embodiments, a seed layer of material is deposited against a top surface of the high-κ dielectric pad and dielectric material deposited at a same layer of the semiconductor device. In some embodiments, a layer of conductive material is deposited over the seed layer to form a blanket layer of the antenna pad material. Over the blanket layer of antenna pad material, a layer of patterning material is deposited and a pattern is transferred to the layer of patterning material, the pattern corresponding to the pattern of the antenna pads of the semiconductor device. Exposed portions of the blanket layer of antenna pad material are etched away by an immersion-style etch configured to react with the exposed portions of the antenna pad material.

In some embodiments, the seed layer is a layer containing copper which is grown on the exposed surfaces by atomic layer deposition (ALD), plasma enhance ALD (PE-ALD), chemical vapor deposition (CVD), plasma enhanced CVD (PECVD), low-pressure CVD (LPCVD), sputtering, or other deposition techniques to deposit seed layer material. A seed layer comprises, in some embodiments, copper, titanium, aluminum, or alloys thereof. Seed layers for the antenna pad are deposited with a thickness ranging from about 1 nanometer to about 4 nanometers, although other thicknesses are also contemplated by the present disclosure. In some embodiments, the antenna pad material is deposited by electroplating or some other method of depositing uniform layers of conductive material over the seed layer. In some embodiments, the antenna pad material includes copper, aluminum, titanium, and/or alloys thereof, or other conductive materials suitable for deposition onto a seed layer for an antenna pad.

Figure 3:
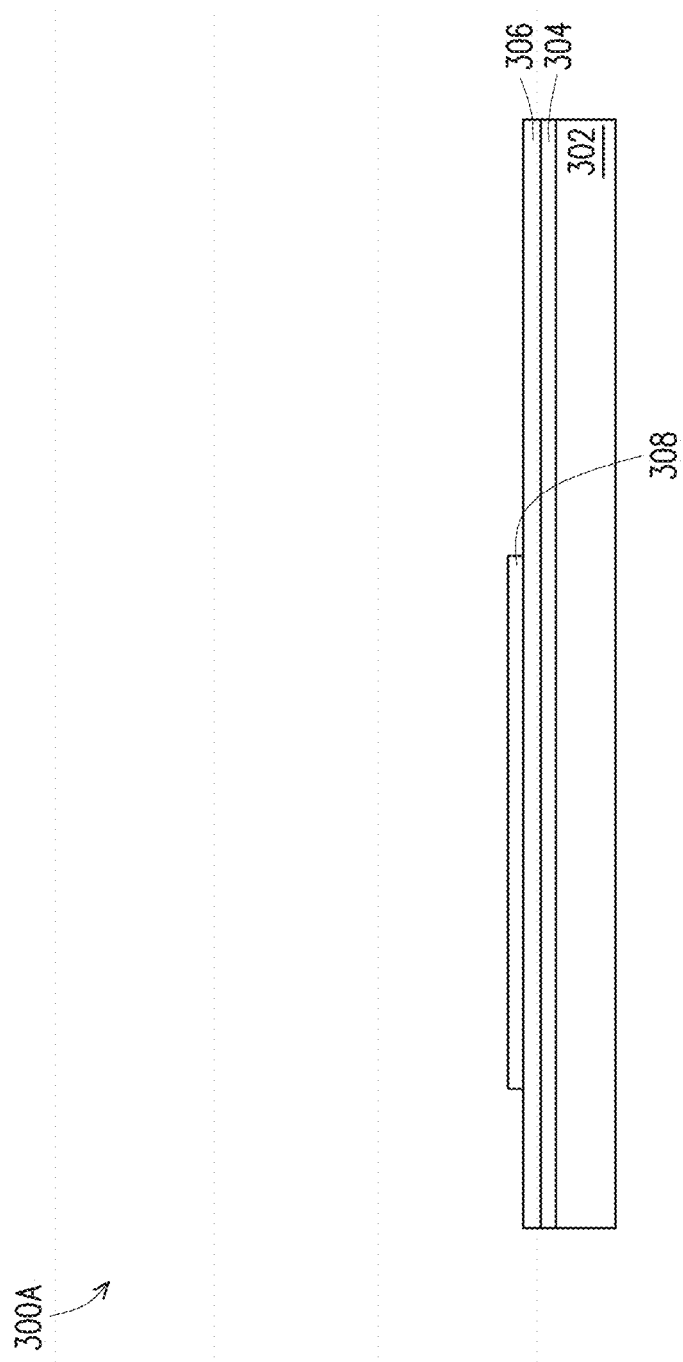
FIG. 3 is a cross-sectional view of a patch antenna during a manufacturing process, in accordance with some embodiments.

FIG. 3 is a cross-sectional view of a patch antenna 300A during a manufacturing process, in accordance with some embodiments. For the discussion, below, of FIG. 3 through FIG. 11, elements which have a similar position or structure or function are identified with a same reference numeral for simplicity. The person of ordinary skill will understand that other embodiments, arrangements, structures, positions, orientations, and configurations of the elements of patch antennas 300A-300I are also within the scope of the present disclosure. In patch antenna 300A, a release layer 304 that is deposited on a rigid substrate 302 separates the rigid substrate 302 from an insulating layer 306. Release layer 304 includes a LTHC (light transfer heat conversion) layer configured to decompose, upon exposure to a wavelength of light, and allow removal of the patch antenna 300A from the rigid substrate 302 without damaging the patch antenna. Insulating layer 306 includes an organic spin-on material applied to the release layer 304 which protects the patch antenna 300A after removal from the rigid substrate 302. Ground plane 308 is deposited over the insulating layer and comprises copper, titanium, aluminum, alloys thereof, or other conductive materials suitable for printed circuit board or patch antenna manufacture. Insulator layer 304 has a thickness of about 2 micrometers, although other thicknesses are also within the scope of the present disclosure. An insulator layer thickness of about 2 micrometers provides protection to the ground plane without introducing excess thickness in the manufactured device. An insulator layer thickness of less then about 2 micrometers is more likely to undergo cracking or delamination than a 2 micrometer insulator film. Ground plane 308 has a thickness ranging from about 8 to about 14 micrometers, and includes both a seed layer thickness (about 1 micrometer to about 5 micrometers) and an electroplated material thickness (about 7 micrometers). Ground planes having thicknesses less than about 8 micrometers are prone to uneven film thickness. Ground plane thicknesses greater than about 14 micrometers are manufactured with additional manufacturing time and materials cost, and do not convey heightened benefit in terms of electrical performance of the device. Ground plane 308 is has a pattern based on a pattern transferred from a first layer of patterning material (e.g., a patterned photolithographic layer) by an etch (e.g, an immersive copper wet etch).

Figure 4:
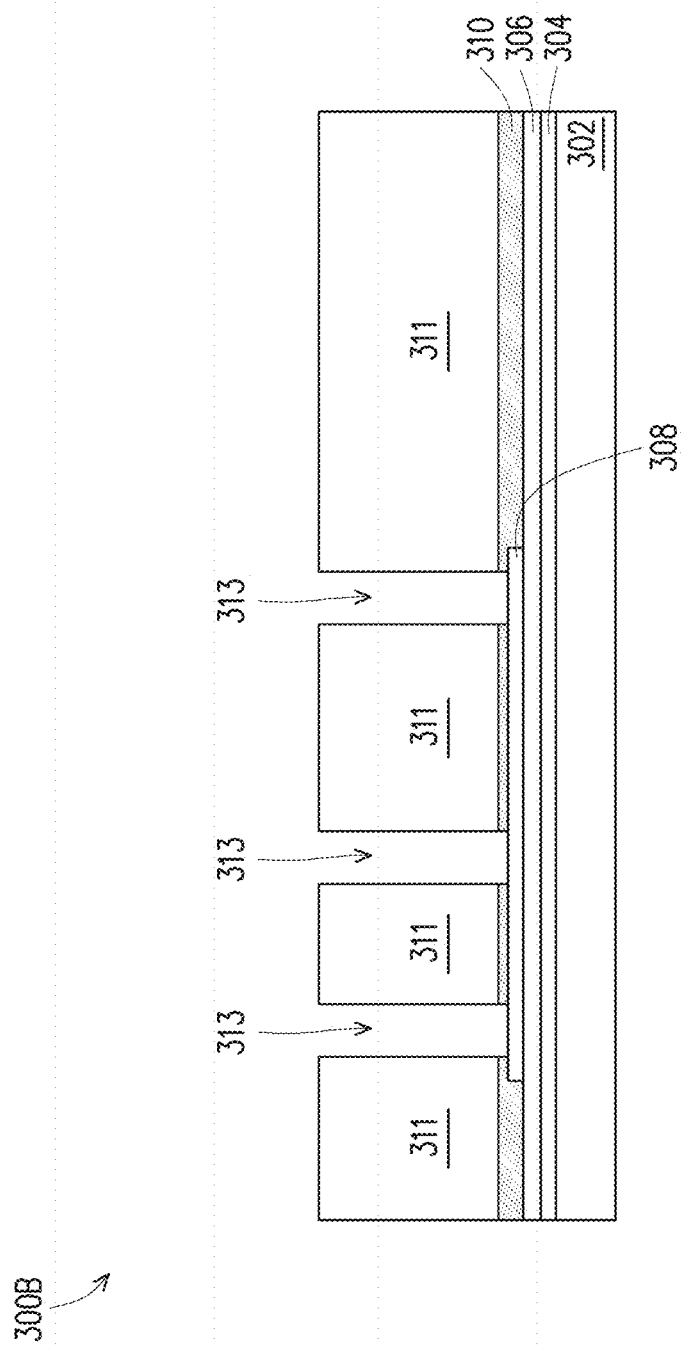
FIG. 4 is a cross-sectional view of a patch antenna during a manufacturing process, in accordance with some embodiments.

FIG. 4 is a cross-sectional view of a patch antenna 300B during a manufacturing process, in accordance with some embodiments. In patch antenna 300B, a second insulating material 310 has been deposited over the top surface of the ground plane 308 and the top surface of the first insulating layer 306 not covered by the ground plane 308. A layer of patterning material 311 has been deposited over the second insulating material 310, and a pattern was transferred to the patterning material 311, such that openings 313 in the patterning material 311 correspond to locations of conductive pillars over the ground plane 308 (see below). The top surface of ground plane 308 is exposed at the bottom of openings 313 (e.g., an etch process has been performed to remove the second insulating material within the openings 313).

Figure 5:
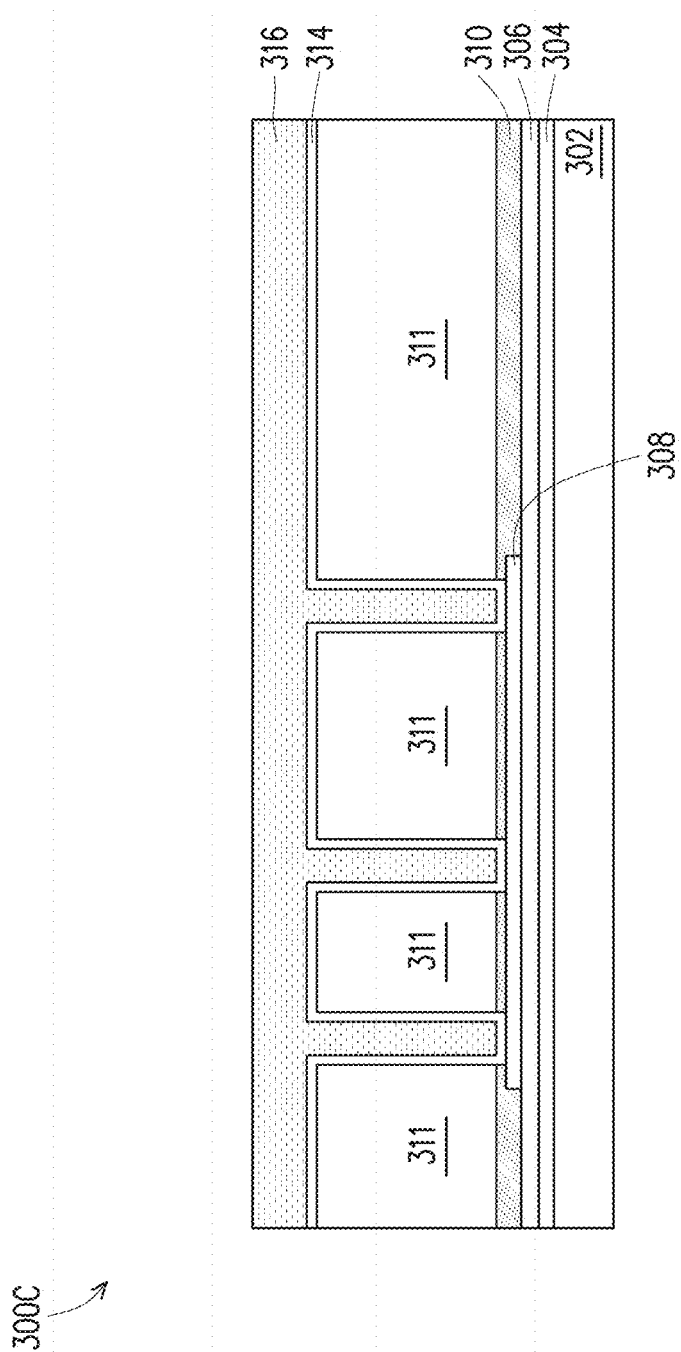
FIG. 5 is a cross-sectional view of a patch antenna during a manufacturing process, in accordance with some embodiments.

FIG. 5 is a cross-sectional view of a patch antenna 300C during a manufacturing process, in accordance with some embodiments. Patch antenna 300C is consistent with a patch antenna during operation 204 of method 200, described above. In patch antenna 300C, a seed layer 314 has been deposited over the patterning material 311, in the openings 313 (now filled), and on the top surface of ground plane 308. Conductive pillar material 316 (e.g., electroplated copper or copper alloy) has been deposited on top of seed layer 314 over the top surface of patterning material 311 and within the openings 313 (now filled) to define conductive pillars within the patterning material 311.

Figure 6:
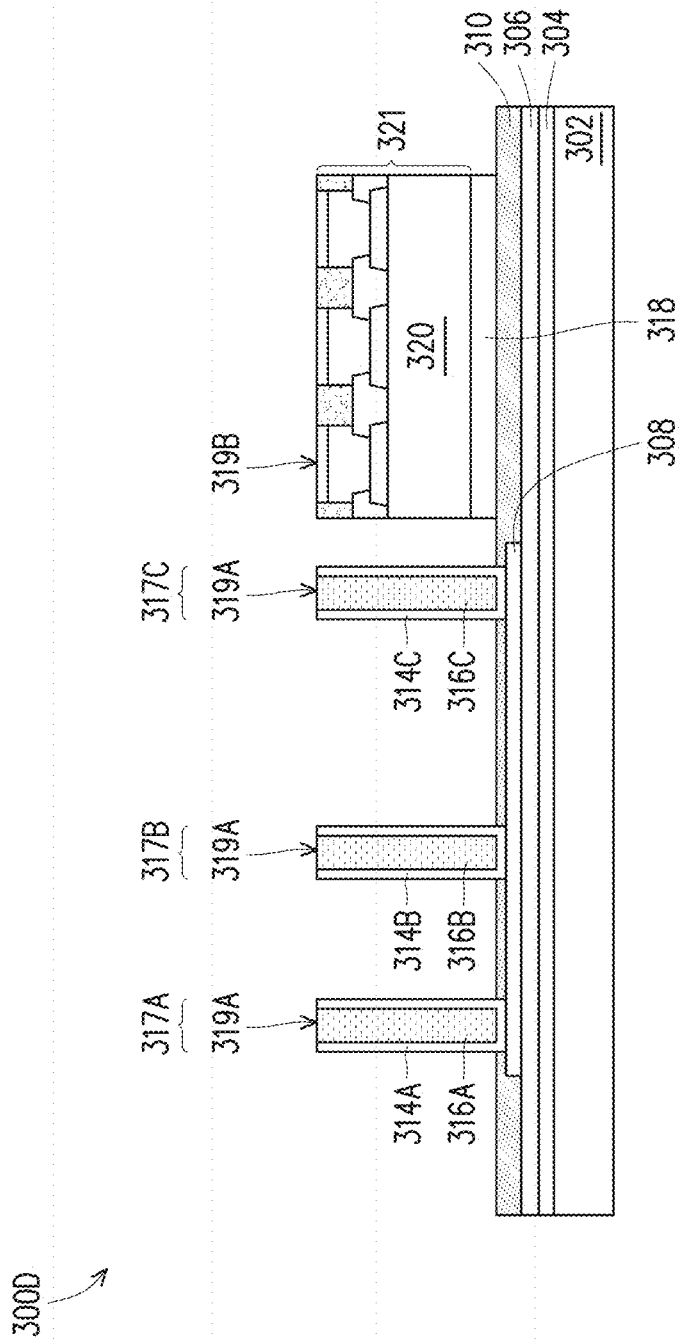
FIG. 6 is a cross-sectional view of a patch antenna during a manufacturing process, in accordance with some embodiments.

FIG. 6 is a cross-sectional view of a patch antenna 300D during a manufacturing process, in accordance with some embodiments. Patch antenna 300D is consistent with embodiments of a patch antenna at the end of operation 206 of method 200. In patch antenna 300D, subsequent to a planarization step to expose the top surface of the conductive pillars 317A, 317B, and 317C, the patterning material 311 has been removed and an RF controller (an RF controller die, or die) 321 has been applied to second insulating material 310 by a die adhesion film 318. Die 321 includes a semiconductor device 320 configured to receive and transmit RF signals using the patch antenna after manufacturing is complete. Pillar 317A includes a seed layer portion 314A and a fill portion 316A, pillar 317B includes a seed layer portion 314B and a fill portion 316B, and pillar 317C includes a seed layer portion 314C and a fill portion 316C. In some embodiments, the top surface 319A of the conductive pillars and the top surface 319B of the die 321 are at a same distance from interface between rigid substrate 302 and release layer 304. In some embodiments, the top surface 319A of the conductive pillars and the top surface 319B of the die 321 are at different distances from the top surface of the rigid substrate, and are brought to have the interface between rigid substrate 302 and release layer 304.

Figure 7:
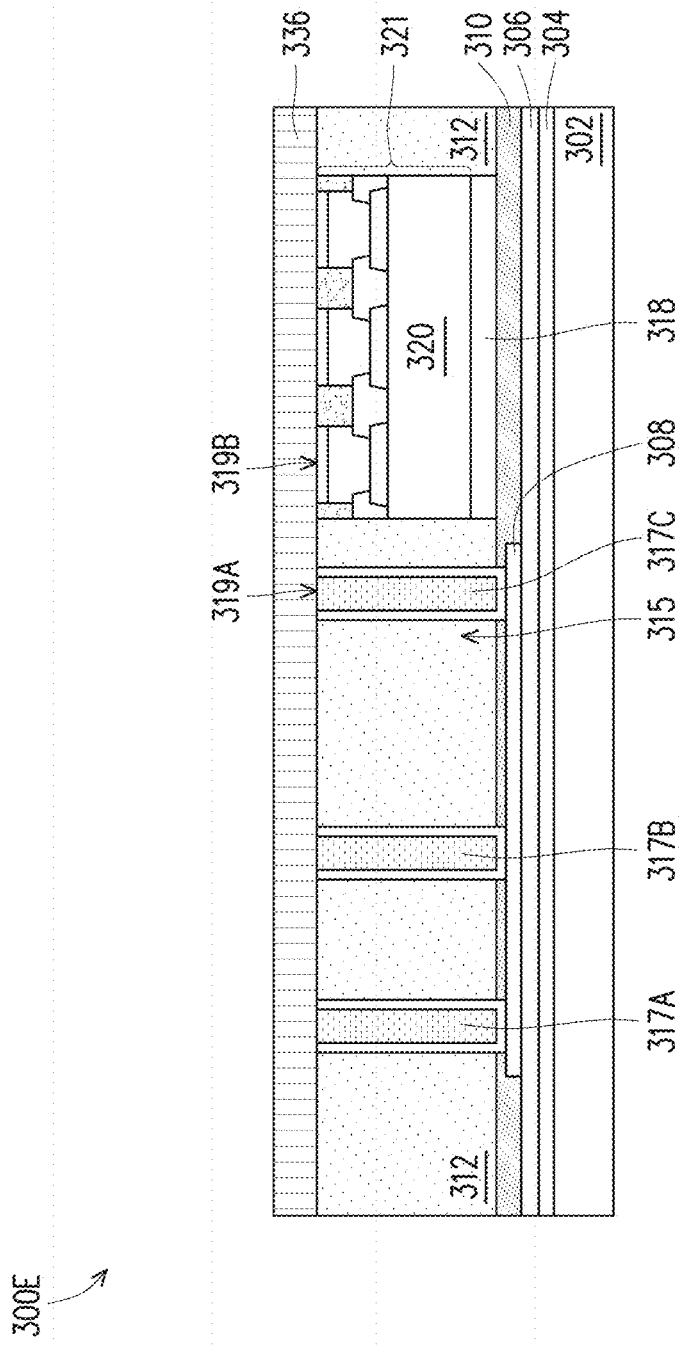
FIG. 7 is a cross-sectional view of a patch antenna during a manufacturing process, in accordance with some embodiments.

FIG. 7 is a cross-sectional view of a patch antenna 300E during a manufacturing process, in accordance with some embodiments. Patch antenna 300E is consistent with a patch antenna during an operation 212 of method 200. In patch antenna 300E, a dielectric fill material 312 has been added to the patch antenna 300E around the conductive pillars and the die 321 over the second insulating material 310. Patch antenna 300E has been planarized and a high-κ dielectric material 336 has been deposited over the top surface 319A of each conductive pillar 317A, 317B, and 317c, and the top surface 319B of the die 321. Patch antenna 300E is consistent with embodiments of a patch antenna during operation 212 of method 200. Antenna cavity 315 is located between conductive pillars 317B and 317C, and above ground plane 308. Dielectric fill material 312 has a low dielectric constant (e.g., below about 6 Farads/meter) in order to reduce capacitance between materials in the same layer as dielectric fill material 312 (e.g., the die 321 and the conductive pillars 317A-317C.

Figure 8:
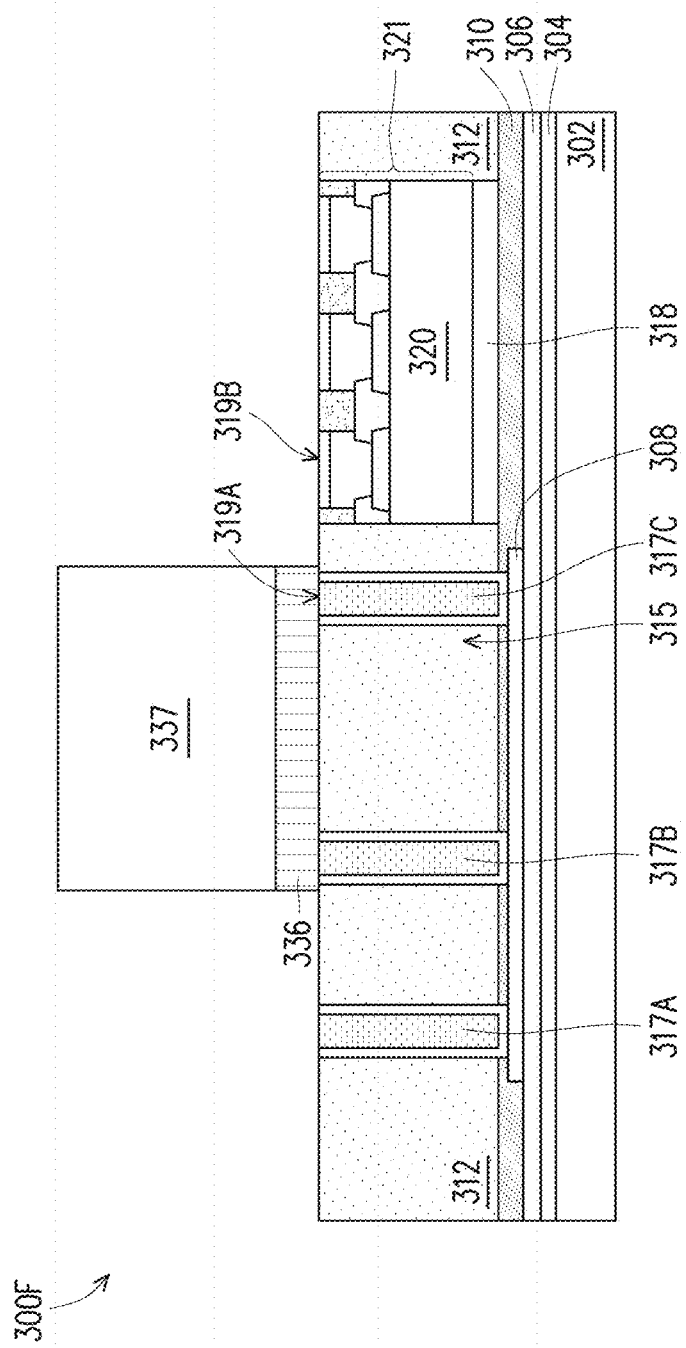
FIG. 8 is a cross-sectional view of a patch antenna during a manufacturing process, in accordance with some embodiments.

FIG. 8 is a cross-sectional view of a patch antenna 300F during a manufacturing process, in accordance with some embodiments. Patch antenna 300F is consistent with a patch antenna during operation 212 of method 200. In patch antenna 300F, the high-κ dielectric material 336 deposited over the top surface 319A of conductive pillars 317B and 317C has been protected by a patterning material 337 to form a dielectric pad. Patterning material 337 has been deposited and received a pattern consistent with the pattern of dielectric pads over the ground plane 308. Not all conductive pillars are in direct contact with the high-κ dielectric material 336. Conductive pillar 317A is laterally spaced from the edge of high-κ dielectric material 336, while in electrical contact with conductive pillars 317B and 317C. Conductive pillar 317A is configured to be a ground connection (see FIG. 1, ground connections 120A-120B) between the ground plane 308 and a ground for the patch antenna 300F. High-K dielectric material 336 is laterally spaced from a top surface 319B of die 321. Antenna cavity 315 is located between ground plane 308 and the high-κ dielectric material 336, and between conductive pillars 317B and 317C.

Figure 9:
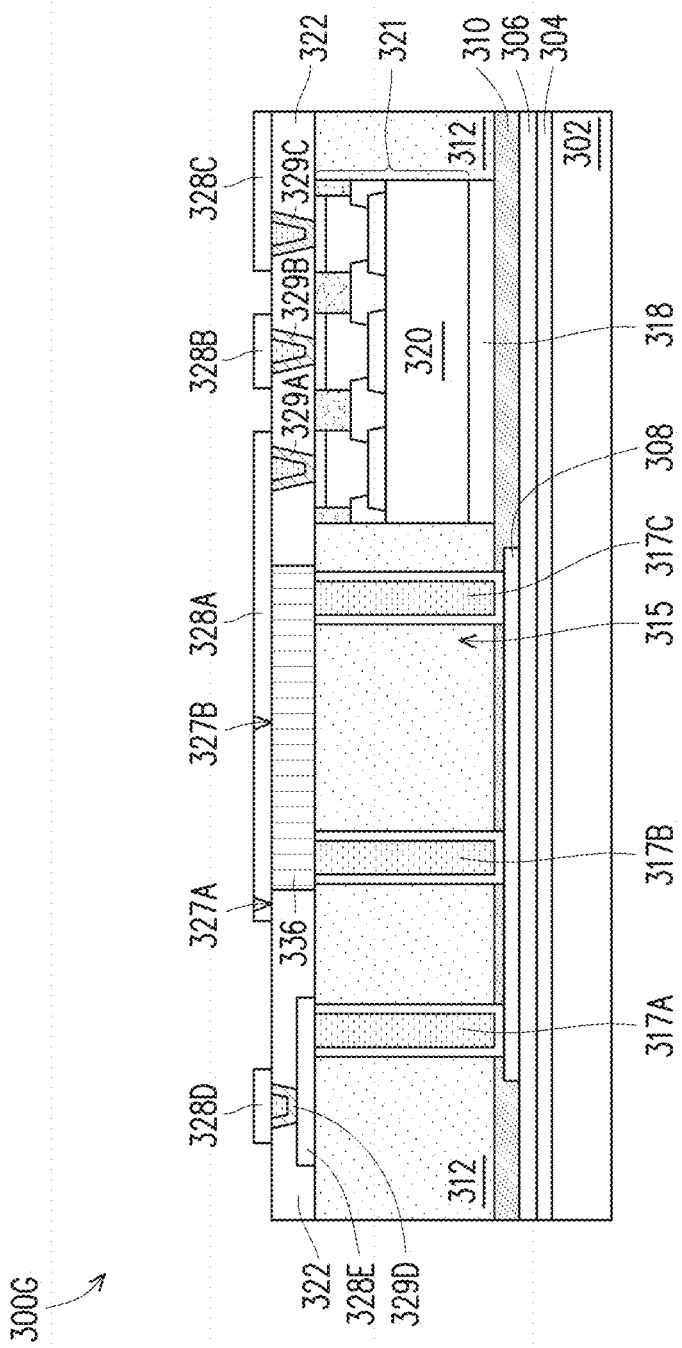
FIG. 9 is a cross-sectional view of a patch antenna during a manufacturing process, in accordance with some embodiments.

FIG. 9 is a cross-sectional view of a patch antenna 300G during a manufacturing process, in accordance with some embodiments. Patch antenna 300G is consistent with a patch antenna during operation 214 of method 200. In patch antenna 300G, conductive line 328E has been manufactured in contact with conductive pillar 317A, and below dielectric layer 322. Dielectric layer 322 is deposited over die 321, and around the sides of the dielectric pad made of high-κ dielectric material 336. Conductive vias 329A-329D extend through dielectric layer 322. Antenna pad 328A is against a top surface of dielectric layer 322 (see interface 327A) and a top surface of the dielectric pad (see interface 327B). Antenna pad 328A electrically connects to die 321 through conductive via 329A. Conductive lines 328B and 328C electrically connect to conductive vias 329B and 329C through dielectric layer 322, forming electrical connections to die 321. Conductive line 328D electrically connects to conductive via 329D, and to ground plane 308 through conductive pillar 317A.

Figure 10:
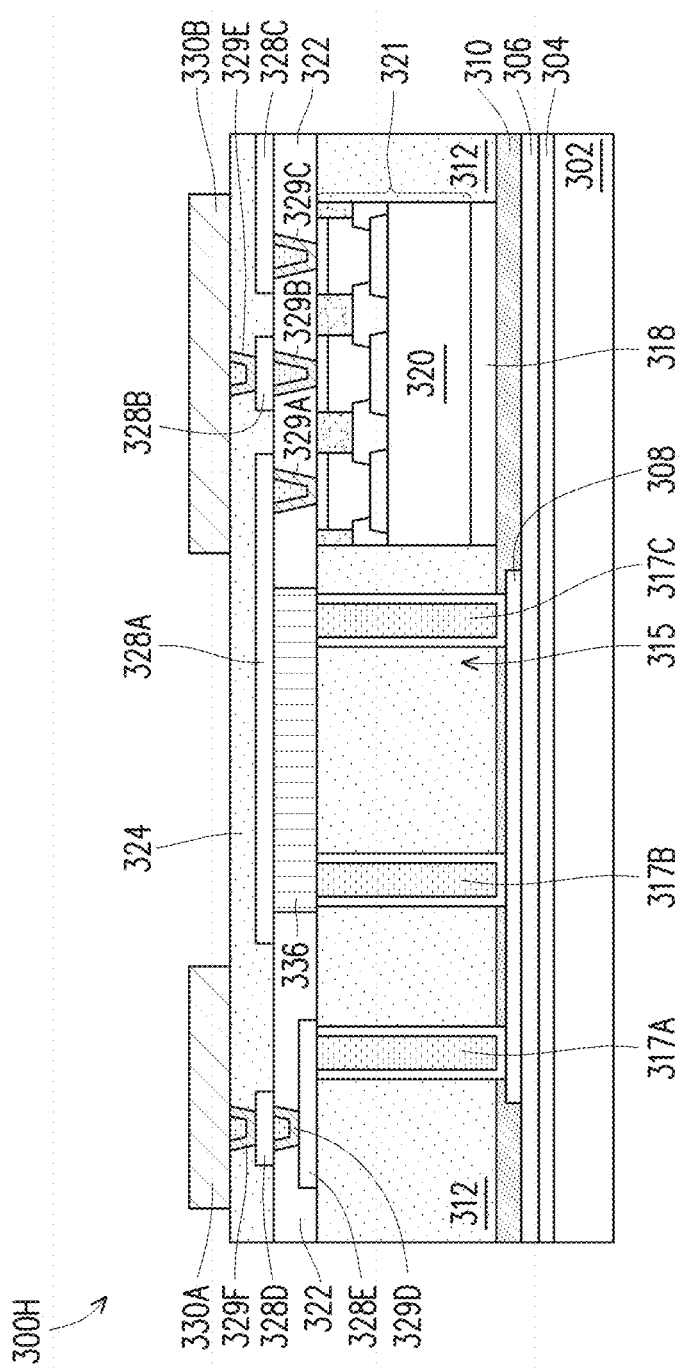
FIG. 10 is a cross-sectional view of a patch antenna during a manufacturing process, in accordance with some embodiments.

FIG. 10 is a cross-sectional view of a patch antenna 300H during a manufacturing process, in accordance with some embodiments. Patch antenna 300H is consistent with a patch antenna after operations 214 and 216 of method 200. In patch antenna 300H, a second dielectric layer 324 has been deposited over antenna pad 328A, and conductive via 329F extends through second dielectric material 324 to electrically connect conductive pad 330A to ground plane 308. Conductive via 329E extends through second dielectric material 324 to electrically connect conductive pad 330B to die 321 through conductive line 328D and conductive via 329B.

Figure 11:
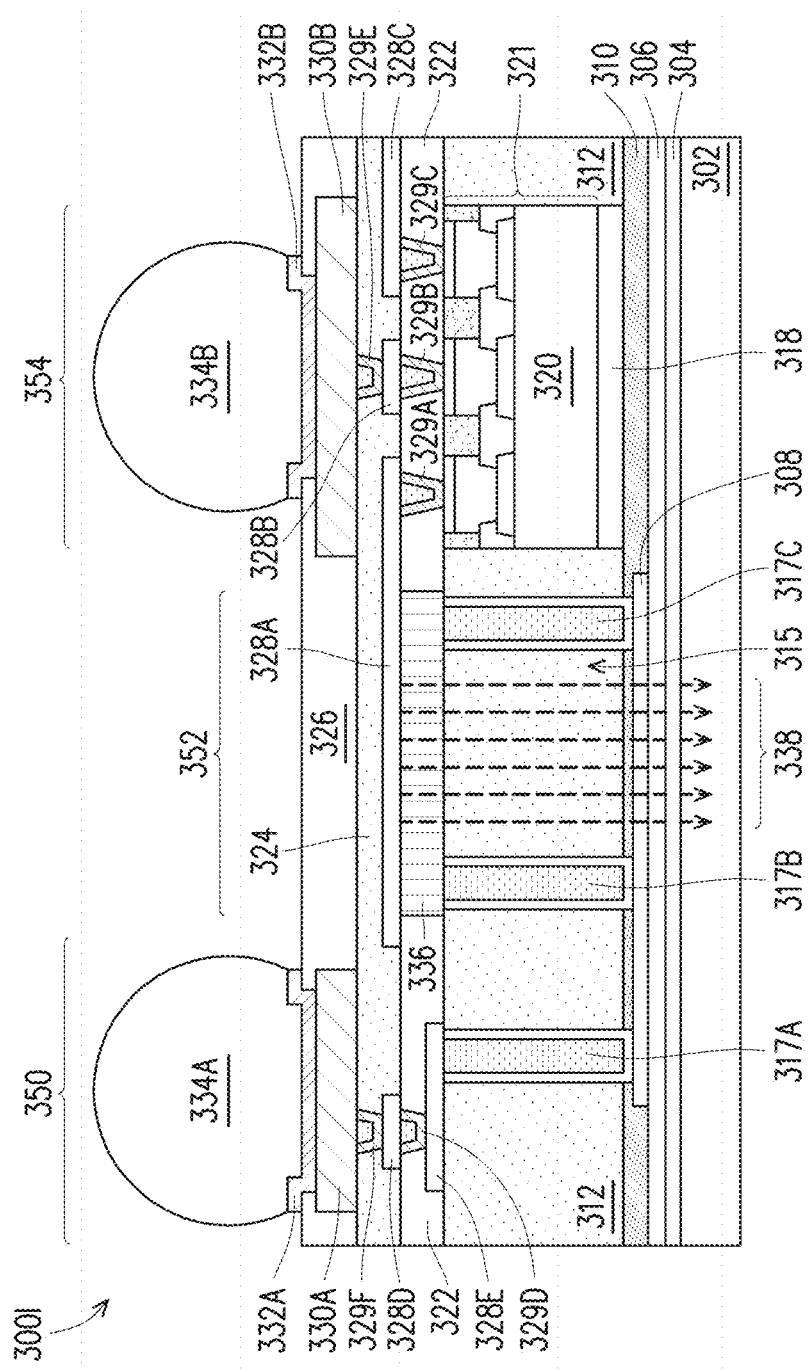
FIG. 11 is a cross-sectional view of a patch antenna during a manufacturing process, in accordance with some embodiments.

FIG. 11 is a cross-sectional view of a patch antenna 300I during a manufacturing process, in accordance with some embodiments. Solder ball 334A electrically connects to the ground plane 308 through under-bump layer 332A, conductive pad 330A, the conductive vias 329D and 329f, the conductive line 328E, and conductive pillar 317A. Conductive pillars 317B and 317C are also electrically connected to ground plane 308, and are around antenna cavity 315, and against a bottom surface of dielectric pad made of high-κ dielectric material 336. Die 321 is electrically connected to antenna pad 328A through conductive via 329A, and to solder bump 334B through conductive vias 329B, 329E, conductive line 328B, and conductive pad 330B. Under bump layer 332B promotes adhesion of solder bump 334B to the conductive pad 330B in the patch antenna 300I. Stack 350 is a ground connection to the ground plane of the patch antenna 300I. Stack 352 is an antenna stack in the patch antenna 300I, configured for high radiation-efficiency sending and receiving of RF signals. Stack 354 is a signal stack, configured to operate the die 321 by providing power and/or signal from another portion of a computing device to the antenna pad 328A through the die 321. In FIG. 11, an RF signal 338 is emitted from an antenna pad 328A through antenna cavity 315 and past ground plane 308 over substrate 302.

Figure 12:
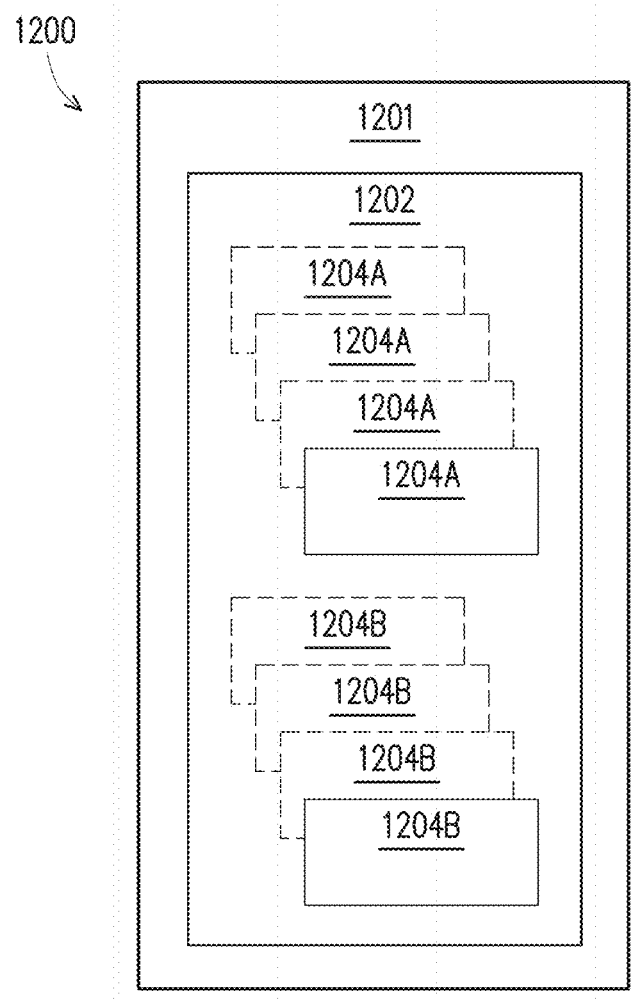
FIG. 12 is a block diagram of a semiconductor device in accordance with some embodiments.

FIG. 12 is a block diagram of a semiconductor device 1200 in accordance with at least one embodiment of the present disclosure. In FIG. 12, semiconductor device 1200 includes, among other things, a substrate 1201 having thereon a circuit macro (hereinafter, macro) 1202. In some embodiments, macro 1202 is an InFO package macro. In some embodiments, macro 1202 is a macro other than an InFO package macro. Macro 1202 includes, among other things, a wire routing arrangement 1204A and a second wire routing arrangement 1204B. Example of layout diagrams resulting in wire routing arrangements 1204A and 1204B include the patch antenna of FIG. 1.

Figure 13:
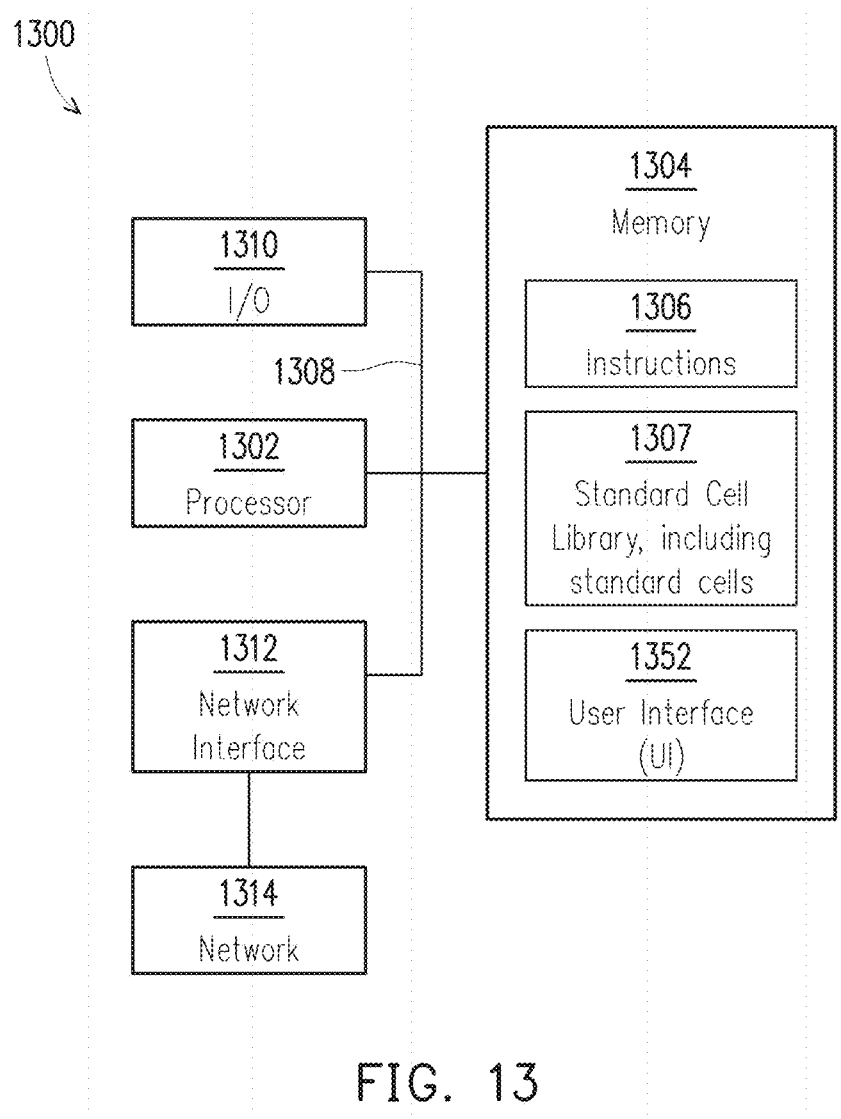
FIG. 13 is a block diagram of an electronic design automation (EDA) system, in accordance with some embodiments.

FIG. 13 is a block diagram of an electronic design automation (EDA) system 1300 in accordance with some embodiments. In some embodiments, EDA system 1300 is a general purpose computing device including a hardware processor 1302 and a non-transitory, computer-readable storage medium 1304. Storage medium 1304, amongst other things, is encoded with, i.e., stores, computer program code 1306 (e.g., a set of executable instructions, or instructions). Execution of instructions 1306 by hardware processor 1302 represents (at least in part) an EDA tool which implements a portion or all of, e.g., the methods described herein in accordance with one or more embodiments (hereinafter, the noted processes and/or methods).

Hardware processor 1302 is electrically coupled to computer-readable storage medium 1304 via a bus 1308. Hardware processor 1302 is also electrically coupled to an I/O interface 1310 by bus 1308. A network interface 1312 is also electrically connected to hardware processor 1302 via bus 1308. Network interface 1312 is connected to a network 1314, so that hardware processor 1302 and computer-readable storage medium 1304 are capable of connecting to external elements via network 1314. Hardware processor 1302 is configured to execute computer program code 1306 encoded in computer-readable storage medium 1304 in order to cause EDA system 1300 to be usable for performing a portion or all of the noted processes and/or methods. In one or more embodiments, hardware processor 1302 is a central processing unit (CPU), a multi-processor, a distributed processing system, an application specific integrated circuit (ASIC), and/or a suitable processing unit.

In one or more embodiments, computer-readable storage medium 1304 is an electronic, magnetic, optical, electromagnetic, infrared, and/or a semiconductor system (or apparatus or device). For example, computer-readable storage medium 1304 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1304 includes a compact disk-read only memory (CD-ROM), a compact disk-read/write (CD-R/W), and/or a digital video disc (DVD).

In one or more embodiments, storage medium 1304 stores computer program code 1306 configured to cause EDA system 1300 (where such execution represents (at least in part) the EDA tool) to be usable for performing a portion or all of the noted processes and/or methods. In one or more embodiments, storage medium 1304 also stores information which facilitates performing a portion or all of the noted processes and/or methods. In one or more embodiments, storage medium 1304 stores a library 1307 of standard cells including such standard cells as disclosed herein.

EDA system 1300 includes I/O interface 1310. I/O interface 1310 is coupled to external circuitry. In one or more embodiments, I/O interface 1310 includes a keyboard, keypad, mouse, trackball, trackpad, touchscreen, and/or cursor direction keys for communicating information and commands to hardware processor 1302.

EDA system 1300 also includes network interface 1312 coupled to hardware processor 1302. Network interface 1312 allows EDA system 1300 to communicate with network 1314, to which one or more other computer systems are connected. Network interface 1312 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 1300.

EDA system 1300 is configured to receive information through I/O interface 1310. The information received through I/O interface 1310 includes one or more of instructions, data, design rules, libraries of standard cells, and/or other parameters for processing by hardware processor 1302. The information is transferred to hardware processor 1302 via bus 1308. EDA system 1300 is configured to receive information related to a UI through I/O interface 1310. The information is stored in computer-readable medium 1304 as user interface (UI) 1352.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1300. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 14:
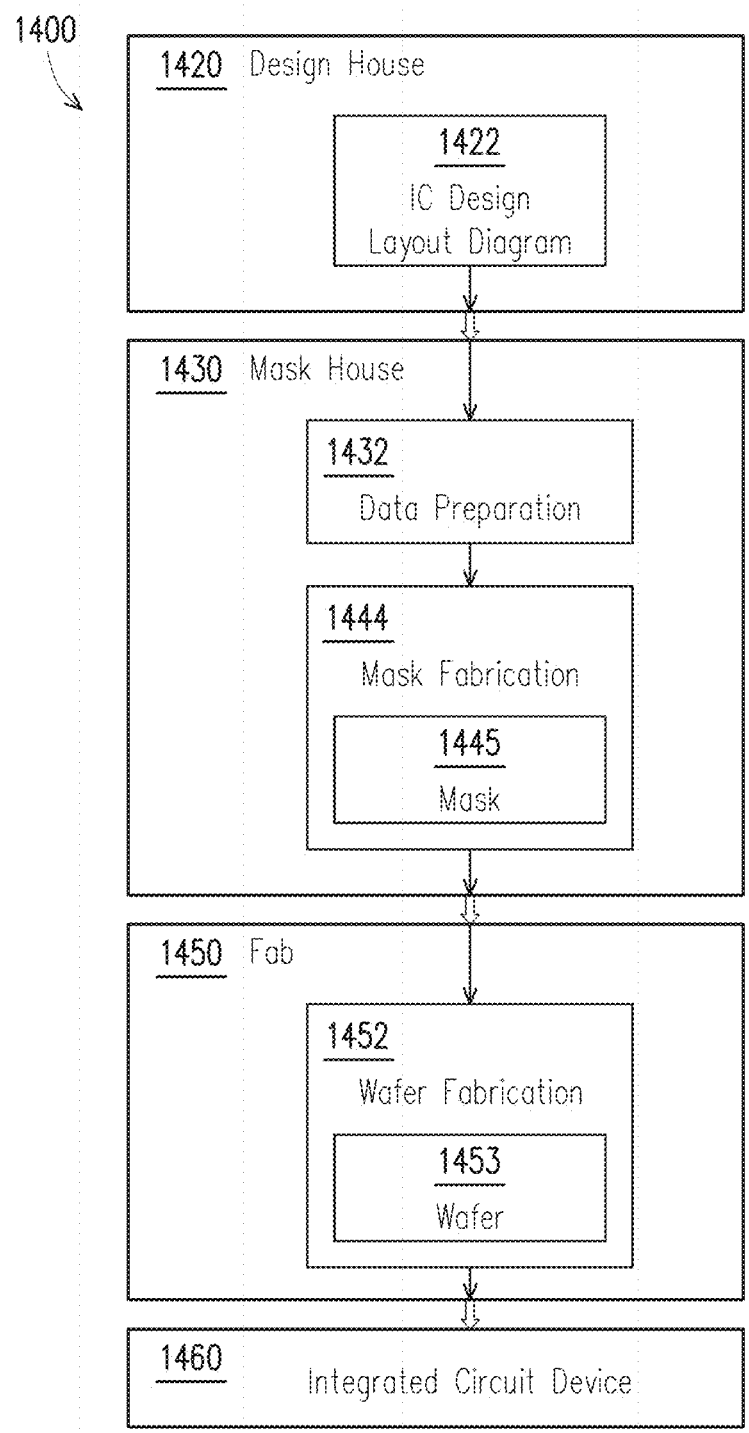
FIG. 14 is a block diagram of an integrated circuit (IC) manufacturing system 1400, and an IC manufacturing flow associated therewith, in accordance with some embodiments.

FIG. 14 is a block diagram of an integrated circuit (IC) manufacturing system 1400, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1400.

In FIG. 14, IC manufacturing system 1400 includes entities, such as a design house 1420, a mask house 1430, and an IC manufacturer/fabricator ("fab") 1450, that interact with one another in the design, development, and manufacturing cycles and/or services related to manufacturing an IC device 1460. The entities in manufacturing system 1400 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1420, mask house 1430, and IC fab 1450 is owned by a single larger company. In some embodiments, two or more of design house 1420, mask house 1430, and IC fab 1450 coexist in a common facility and use common resources.

Design house (or design team) 1420 generates an IC design layout diagram 1422. IC design layout diagram 1422 includes various geometrical patterns designed for an IC device 1460. The geometrical patterns correspond to patterns of metal, oxide, or semiconductor layers that make up the various components of IC device 1460 to be fabricated. The various layers combine to form various IC features. For example, a portion of IC design layout diagram 1422 includes various IC features, such as an active region, gate electrode, source and drain, metal lines or vias of an inter-layer interconnection, and openings for bonding pads, to be formed in a semiconductor substrate (such as a silicon wafer) and various material layers disposed on the semiconductor substrate. Design house 1420 implements a proper design procedure to form IC design layout diagram 1422. The design procedure includes one or more of logic design, physical design or place and route. IC design layout diagram 1422 is presented in one or more data files having information of the geometrical patterns. For example, IC design layout diagram 1422 can be expressed in a GDSII file format or DFII file format.

Mask house 1430 includes data preparation 1432 and mask fabrication 1444. Mask house 1430 uses IC design layout diagram 1422 to manufacture one or more masks 1445 to be used for fabricating the various layers of IC device 1460 according to IC design layout diagram 1422. Mask house 1430 performs mask data preparation 1432, where IC design layout diagram 1422 is translated into a representative data file ("RDF"). Mask data preparation 1432 provides the RDF to mask fabrication 1444. Mask fabrication 1444 includes a mask writer. A mask writer converts the RDF to an image on a substrate, such as a mask (reticle) 1445 or a semiconductor wafer 1453. The design layout diagram 1422 is manipulated by mask data preparation 1432 to comply with particular characteristics of the mask writer and/or requirements of IC fab 1450. In FIG. 14, mask data preparation 1432 and mask fabrication 1444 are illustrated as separate elements. In some embodiments, mask data preparation 1432 and mask fabrication 1444 can be collectively referred to as mask data preparation.

In some embodiments, mask data preparation 1432 includes optical proximity correction (OPC) which uses lithography enhancement techniques to compensate for image errors, such as those that can arise from diffraction, interference, other process effects and the like. OPC adjusts IC design layout diagram 1422. In some embodiments, mask data preparation 1432 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1432 includes a mask rule checker (MRC) that checks the IC design layout diagram 1422 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1422 to compensate for limitations during mask fabrication 1444, which may undo part of the modifications performed by OPC in order to meet mask creation rules.

In some embodiments, mask data preparation 1432 includes lithography process checking (LPC) that simulates processing that will be implemented by IC fab 1450 to fabricate IC device 1460. LPC simulates this processing based on IC design layout diagram 1422 to create a simulated manufactured device, such as IC device 1460. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1422.

It should be understood that the above description of mask data preparation 1432 has been simplified for the purposes of clarity. In some embodiments, data preparation 1432 includes additional features such as a logic operation (LOP) to modify the IC design layout diagram 1422 according to manufacturing rules. Additionally, the processes applied to IC design layout diagram 1422 during data preparation 1432 may be executed in a variety of different orders.

After mask data preparation 1432 and during mask fabrication 1444, a mask 1445 or a group of masks 1445 are fabricated based on the modified IC design layout diagram 1422. In some embodiments, mask fabrication 1444 includes performing one or more lithographic exposures based on IC design layout diagram 1422. In some embodiments, an electron-beam (e-beam) or a mechanism of multiple e-beams is used to form a pattern on a mask (photomask or reticle) 1445 based on the modified IC design layout diagram 1422. Mask 1445 can be formed in various technologies. In some embodiments, mask 1445 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1445 includes a transparent substrate (e.g., fused quartz) and an opaque material (e.g., chromium) coated in the opaque regions of the binary mask. In another example, mask 1445 is formed using a phase shift technology. In a phase shift mask (PSM) version of mask 1445, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1444 is used in a variety of processes. For example, such a mask(s) is used in an ion implantation process to form various doped regions in semiconductor wafer 1453, in an etching process to form various etching regions in semiconductor wafer 1453, and/or in other suitable processes.

IC fab 1450 includes wafer fabrication 1452. IC fab 1450 is an IC fabrication business that includes one or more manufacturing facilities for the fabrication of a variety of different IC products. In some embodiments, IC Fab 1450 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1450 uses mask(s) 1445 fabricated by mask house 1430 to fabricate IC device 1460. Thus, IC fab 1450 at least indirectly uses IC design layout diagram 1422 to fabricate IC device 1460. In some embodiments, semiconductor wafer 1453 is fabricated by IC fab 1450 using mask(s) 1445 to form IC device 1460. In some embodiments, the IC fabrication includes performing one or more lithographic exposures based at least indirectly on IC design layout diagram 1422. Semiconductor wafer 1453 includes a silicon substrate or other proper substrate having material layers formed thereon. Semiconductor wafer 1453 further includes one or more of various doped regions, dielectric features, multi-level interconnects, and the like (formed at subsequent manufacturing steps).

Details regarding an integrated circuit (IC) manufacturing system (e.g., manufacturing system 1400 of FIG. 14), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

An integrated fan out (InFO) device includes an RF controller (a die) electrically connected to at least one antenna pad having a high-κ dielectric material (dielectric pad) situated between the at least one antenna pad and an antenna cavity above a ground plane. The addition of a high-κ dielectric material between the ground plane and the antenna pad increases the range of available frequencies which are accessible to the antenna pad, and allows a device manufacturer to shrink the footprint or area of the InFO device. Further, radio frequency emission is more efficient than for InFO devices without a dielectric pad between the antenna pad and the ground plane.

Aspects of the present disclosure relate to a device which includes a ground plane; a first conductive pillar, wherein the first conductive pillar is electrically connected to the ground plane; an antenna pad substantially parallel to the ground plane; a dielectric pad having a first dielectric constant, wherein the antenna pad is separated from a distal end of the at least one conductive pillar by the dielectric pad; and a dielectric fill material filling an antenna cavity, wherein the dielectric fill material has a second dielectric constant smaller than the first dielectric constant, and the ground plane, the first conductive pillar, and the dielectric pad surround the antenna cavity. In some embodiments, the second dielectric constant is 6 Farads/meter (F/m) or less. In some embodiments, the first dielectric constant is greater than 7 Farads/meter (F/m). In some embodiments, the dielectric pad includes one or more of titanium dioxide (TiO$_2$), strontium titanium trioxide (SrTiO$_3$), barium strontium titanium trioxide (BaSrTiO$_3$), barium titanium trioxide (BaTiO$_3$), or lead zirconium titanium trioxide (PbZrTiO$_3$). In some embodiments, the dielectric pad is a laminated dielectric pad comprising at least one layer of high-k dielectric material having a dielectric constant greater than 7 Farads/meter (F/m) and at least one layer of low-k dielectric material having a dielectric constant less than 6 F/m. In some embodiments, the antenna pad is electrically connected to a controller circuit. In some embodiments, the dielectric pad has a first dimension in a first direction parallel to a top surface of the ground plane and a second dimension in a second direction parallel to the top surface of the ground plane, the second direction is perpendicular to the first direction, the antenna pad has a third dimension in the first direction and a fourth dimension in the second direction, and the first dimension is the smaller than the third dimension, and the second dimension is smaller than the fourth dimension.

Aspects of the present disclosure relate to a method which includes operations of forming a ground plane over a substrate; forming a first conductive pillar in contact with the ground plane; attaching a die to the substrate; electrically isolating the die from the first conductive pillar with a dielectric fill material; forming a dielectric pad of a high-κ dielectric material having a dielectric constant of at least 7 Farads/meter (F/m) at an end of the first conductive pillar opposite the ground plane; forming an antenna pad over the dielectric pad; and electrically connecting the antenna pad to the die. In some embodiments, forming a dielectric pad further includes depositing a high-κ dielectric material with a chemical vapor deposition (CVD) or a physical vapor deposition (PVD) technique, the high-κ dielectric material having a dielectric constant greater than 7; depositing a layer of patterning material over the high-κ dielectric material; patterning the layer of patterning material; and removing an exposed portion of the high-κ dielectric material. In some embodiments, removing an exposed portion of the high-κ dielectric material further includes applying an acidic solution to the exposed portion of the at least one layer of dielectric material to dissolve the exposed portion. In some embodiments, electrically isolating the die from the at least one conductive pillar with a dielectric fill material further includes applying a molding compound to a top surface of the ground plane; and curing the low-κ dielectric material at a temperature below 200° Celsius (° C.) to reduce stress on the die and the first conductive pillar. In some embodiments, manufacturing a first conductive pillar in contact with the ground plane further includes depositing a first insulating layer over the ground plane, applying a layer of patterning material over the first insulating layer, exposing, through the layer of patterning material, the a portion of the ground plane, depositing, within an opening in the layer of patterning material and against a the portion of the ground plane, a conductive material, planarizing the conductive material to expose the layer of patterning material, and removing the patterning material from the ground plane. In some embodiments, forming a dielectric pad of a high-κ dielectric material further includes depositing a plurality layers of high-κ dielectric material, each with a dielectric constant greater than 7 Farads/meter. In some embodiments, the method further includes covering the antenna pad and the die with a low-κ dielectric material having a dielectric constant less than 7 Farads/meter.

Some aspects of the present disclosure relate to a device which includes a first pad of conductive material over a substrate, wherein the first pad is electrically connected to a ground plane; an insulating fill material over the first pad, the insulating fill material having a first dielectric constant less than 7 Farads/meter (F/m); a first conductive pillar electrically connected to the first pad of conductive material, wherein the first conductive pillar extends through the insulating fill material; a controller die connected to the substrate, wherein the controller die extends through the layer of insulating fill material; a pad of dielectric material over a top surface of the insulating fill material and the first conductive pillar, the pad of dielectric material having a second dielectric constant greater than 7 Farads/meter; and a second pad of conductive material over the pad of dielectric material, wherein the second pad of conductive material is electrically connected to the controller die. In some embodiments, a perimeter of the pad of dielectric material, projected onto the ground plane, circumscribes the first conductive pillar. In some embodiments, the pad of dielectric material further includes at least one layer of a dielectric material having a first dielectric constant greater than 7 Farads/meter (F/m). In some embodiments, the dielectric pad includes one or more of titanium dioxide ($TiO_2$), strontium titanium trioxide ($SrTiO_3$), barium strontium titanium trioxide ($BaSrTiO_3$), barium titanium trioxide ($BaTiO_3$), or lead zirconium titanium trioxide ($PbZrTiO_3$). In some embodiments, the dielectric pad includes at least two layers of dielectric material, wherein each of the at least two layers of dielectric material has a dielectric constant greater than 7 Farads/meter. In some embodiments, the device further includes a third pad of conductive material over the pad of dielectric material and electrically connected to the controller die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a ground plane;
    a first conductive pillar, wherein the first conductive pillar is electrically connected to the ground plane and has a first pillar diameter;
    a second conductive pillar, wherein the second conductive pillar is electrically connected to the ground plane, wherein the first and second pillars are separated by a pillar spacing distance equal to at least 3 times the first pillar diameter;
    an antenna pad substantially parallel to the ground plane;
    a dielectric pad having a first dielectric constant, wherein the antenna pad is separated from a distal end of the first conductive pillar by the dielectric pad; and
    a dielectric fill material filling an antenna cavity, wherein the dielectric fill material has a second dielectric constant smaller than the first dielectric constant, wherein the ground plane is arranged below and the dielectric pad is arranged above the antenna cavity, and the first and second pillars are separated by a continuous portion of the dielectric fill material.

2. The device of claim 1, wherein the second dielectric constant is between 1 Farads/meter and 6 Farads/meter (F/m).

3. The device of claim 1, wherein the first dielectric constant is greater than 7 Farads/meter (F/m).

4. The device of claim 3, wherein the dielectric pad comprises one or more of titanium dioxide ($TiO_2$), strontium titanium trioxide ($SrTiO_3$), barium strontium titanium trioxide ($BaSrTiO_3$), barium titanium trioxide ($BaTiO_3$), or lead zirconium titanium trioxide ($PbZrTiO_3$).

5. The device of claim 1, wherein the dielectric pad is a laminated dielectric pad comprising at least one layer of high-k dielectric material having a dielectric constant greater than 7 Farads/meter (F/m) and at least one layer of low-k dielectric material having a dielectric constant less than 6 F/m.

6. The device of claim 1, wherein the antenna pad is electrically connected to a controller circuit.

7. The device of claim 1, wherein the dielectric pad has a first dimension in a first direction parallel to a top surface of the ground plane and a second dimension in a second direction parallel to the top surface of the ground plane, the second direction is perpendicular to the first direction, the antenna pad has a third dimension in the first direction and a fourth dimension in the second direction, and the first dimension is smaller than the third dimension, and the second dimension is smaller than the fourth dimension.

8. A device, comprising:
    a first pad of conductive material over a substrate, wherein the first pad is a ground plane;
    an insulating fill material filling an antenna cavity over the first pad, the insulating fill material having a first dielectric constant less than 7 Farads/meter (F/m);
    a first conductive pillar electrically connected to the first pad of conductive material, wherein the first conductive pillar extends through the insulating fill material;
    a controller die connected to the substrate, wherein the controller die extends through within an opening formed in the insulating fill material;
    a pad of dielectric material over a top surface of the insulating fill material and the first conductive pillar, wherein the pad of dielectric material includes a first dielectric layer having a second dielectric constant greater than 7 Farads/meter and a second layer having a third dielectric constant greater than 7 Farads/meter; and
    a second pad of conductive material over the pad of dielectric material, wherein the second pad of conductive material is electrically connected to the controller die.

9. The device of claim 8, wherein a perimeter of the pad of dielectric material, projected onto the ground plane, circumscribes the first conductive pillar.

10. The device of claim 8, wherein the pad of dielectric material comprises one or more of titanium dioxide ($TiO_2$), strontium titanium trioxide ($SrTiO_3$), barium strontium titanium trioxide ($BaSrTiO_3$), barium titanium trioxide ($BaTiO_3$), or lead zirconium titanium trioxide ($PbZrTiO_3$).

11. The device of claim 8, wherein the pad of dielectric material comprises N layers, wherein N>2, of at least two different dielectric materials, wherein each of the dielectric materials has an independent dielectric constant greater than 7 Farads/meter.

12. The device of claim 8, further comprising a third pad of conductive material over the pad of dielectric material and electrically connected to the controller die.

13. A device, comprising:
    a substrate;
    a first insulating layer over the substrate;
    a first pad of conductive material over the first insulating layer, wherein the first pad is electrically connected to a ground contact;

an insulating fill material filling an antenna cavity over the first pad, the insulating fill material having a first dielectric constant;
a first conductive pillar extending through the insulating fill material and electrically connected to the first pad of conductive material;
a controller die mounted on the substrate;
a pad of dielectric material formed on top surface of the insulating fill material, the pad of dielectric material comprising at least a first layer dielectric material having a second dielectric constant and a second layer dielectric material having a third dielectric constant, wherein the first and second dielectric materials form a composite dielectric structure having a composite dielectric constant greater than 7 Farads/meter; and
a second pad of conductive material over the pad of dielectric material, wherein the second pad of conductive material is electrically connected to the controller die.

14. The device according to claim 13, wherein:
the second dielectric constant is at least 7 Farads/meter.

15. The device according to claim 13, wherein,
wherein a perimeter of the pad of dielectric material, projected onto the ground plane, encompasses the first conductive pillar.

16. The device according to claim 15, further comprising:
second, third, and fourth conductive pillars, wherein the perimeter of the pad of dielectric material, projected onto the ground plane, defines a polygon having at least four vertices encompassing the first, second, third, and fourth conductive pillars and wherein each of the first, second, third, and fourth conductive pillars is adjacent a different one of the vertices.

17. The device according to claim 13, wherein:
the pad of dielectric material comprises a dielectric material selected from the group consisting of titanium dioxide ($TiO_2$), strontium titanium trioxide ($SrTiO_3$), barium strontium titanium trioxide ($BaSrTiO_3$), barium titanium trioxide ($BaTiO_3$), lead zirconium titanium trioxide ($PbZrTiO_3$), and combinations and mixtures thereof.

18. The device according to claim 13, wherein:
the first dielectric material is different from the second dielectric material.

19. The device according to claim 13, wherein:
the pad of dielectric material further comprises a third layer dielectric material having a fourth dielectric constant, wherein the first, second, and third dielectric materials form the composite dielectric structure.

* * * * *